(12) United States Patent
Endo et al.

(10) Patent No.: US 8,510,588 B2
(45) Date of Patent: Aug. 13, 2013

(54) CLOCK GENERATION CIRCUIT AND SEMICONDUCTOR DEVICE INCLUDING THE SAME

(75) Inventors: Masami Endo, Kanagawa (JP);
Takayuki Ikeda, Kanagawa (JP);
Daisuke Kawae, Kanagawa (JP);
Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/353,497

(22) Filed: Jan. 19, 2012

(65) Prior Publication Data
US 2012/0173915 A1    Jul. 5, 2012

Related U.S. Application Data

(63) Continuation of application No. 11/845,391, filed on Aug. 27, 2007, now Pat. No. 8,103,897.

(30) Foreign Application Priority Data

Aug. 31, 2006    (JP) .................................. 2006-236846

(51) Int. Cl.
*G06F 1/04* (2006.01)
(52) U.S. Cl.
USPC ............................ 713/500; 713/501; 713/502
(58) Field of Classification Search
None
See application file for complete search history.

(56) References Cited

U.S. PATENT DOCUMENTS

| | | | |
|---|---|---|---|
| 5,787,132 A | 7/1998 | Kishigami et al. | |
| 6,230,021 B1 | 5/2001 | Ohdachi | |
| 7,333,151 B2 | 2/2008 | Ozawa | |
| 7,359,473 B2 | 4/2008 | Tanaka | |
| 7,450,675 B2 | 11/2008 | Wang et al. | |
| 2004/0264620 A1 | 12/2004 | Tanaka | |
| 2005/0078783 A1 | 4/2005 | Okita | |
| 2005/0264696 A1 | 12/2005 | Ozawa | |
| 2006/0158312 A1 | 7/2006 | Park et al. | |

FOREIGN PATENT DOCUMENTS

| | | |
|---|---|---|
| CN | 1703074 A | 11/2005 |
| JP | 2005-20172 | 1/2005 |
| JP | 2005-338619 | 12/2005 |
| JP | 2006-196001 | 7/2006 |
| TW | 200638206 | 11/2006 |

OTHER PUBLICATIONS

Office Action re Chinese application No. CN 200710147241.9, dated Nov. 30, 2010.
Office Action re Taiwan application No. TW 96131680, dated Apr. 29, 2013 (with English translation).

*Primary Examiner* — Dennis M Butler
(74) *Attorney, Agent, or Firm* — Husch Blackwell LLP

(57) ABSTRACT

Objects of the invention are to provide a clock generation circuit and to provide a semiconductor device including the clock generation circuit. The clock generation circuit includes an edge detection circuit, a reference clock generation circuit, a reference clock counter circuit, and a frequency-divider circuit. The reference clock counter circuit is a circuit which outputs a counter value, which is obtained by counting the number of waves of a reference clock signal outputted from the reference clock generation circuit, in a period of time from when the edge detection circuit detects an edge of a signal which is externally inputted to the edge detection circuit to when the edge detection circuit detects the next edge, to the frequency-divider circuit. The frequency-divider circuit is a circuit which frequency-divides the reference clock signal based on the counter value.

21 Claims, 18 Drawing Sheets

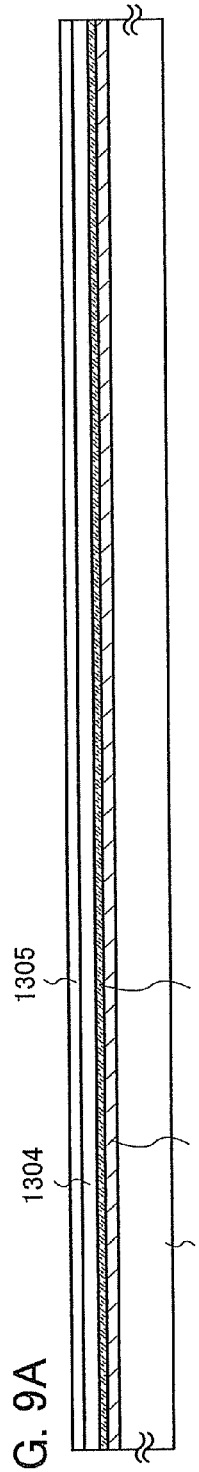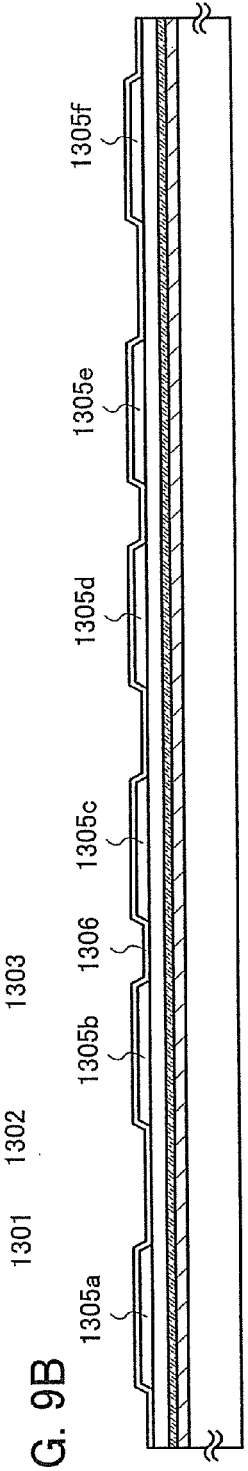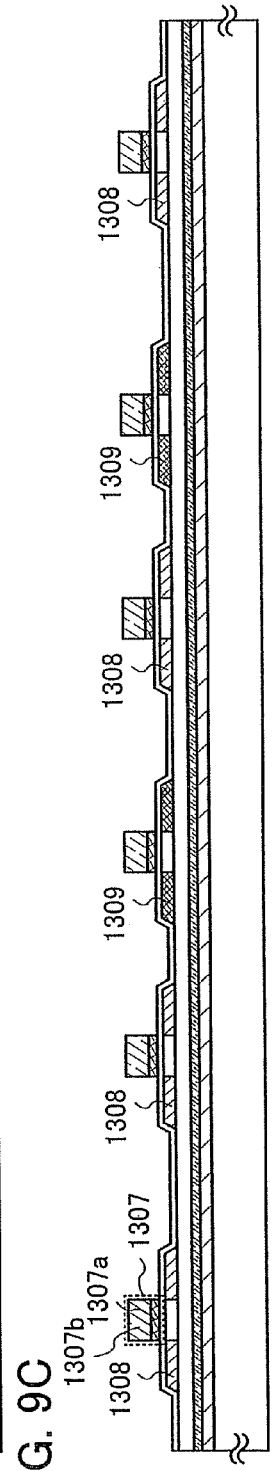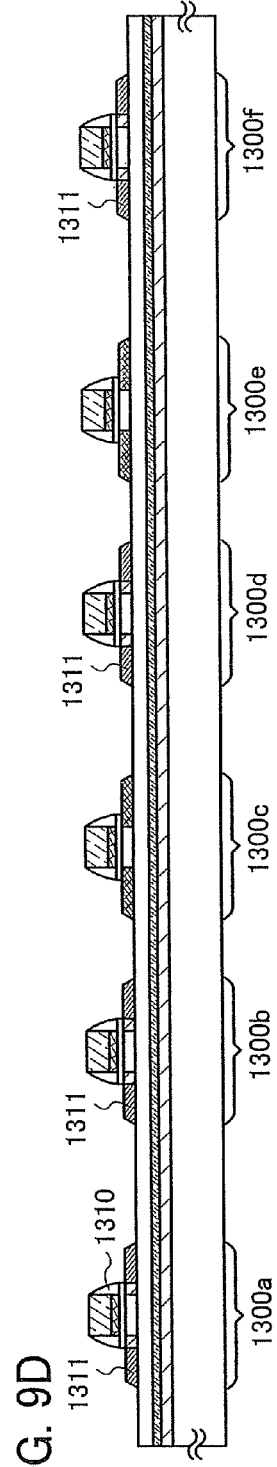
FIG. 9A
FIG. 9B
FIG. 9C
FIG. 9D

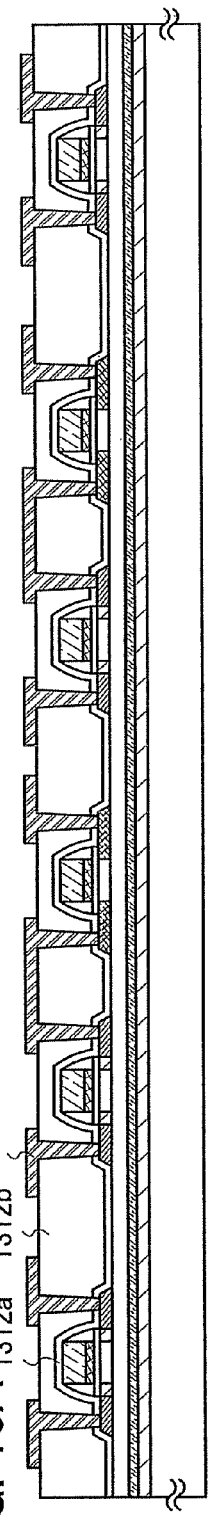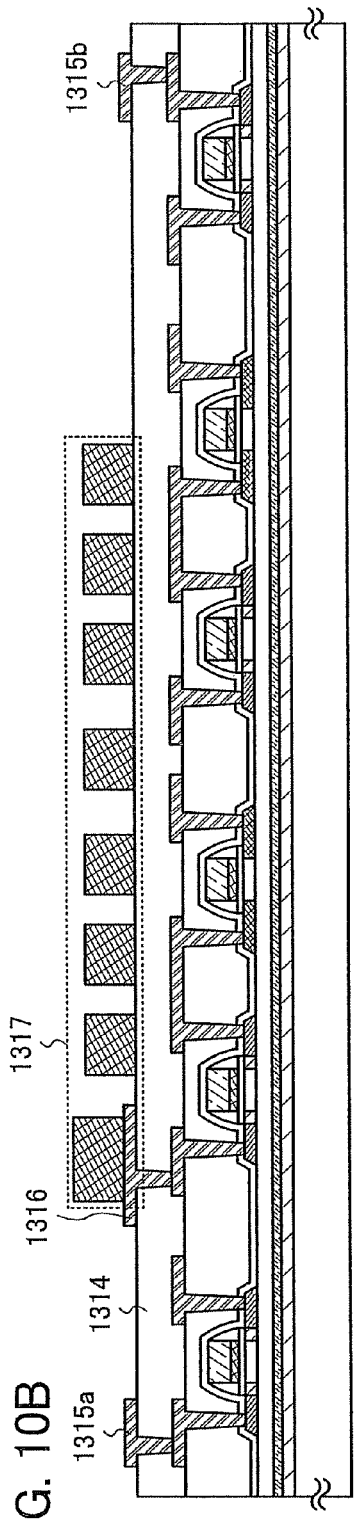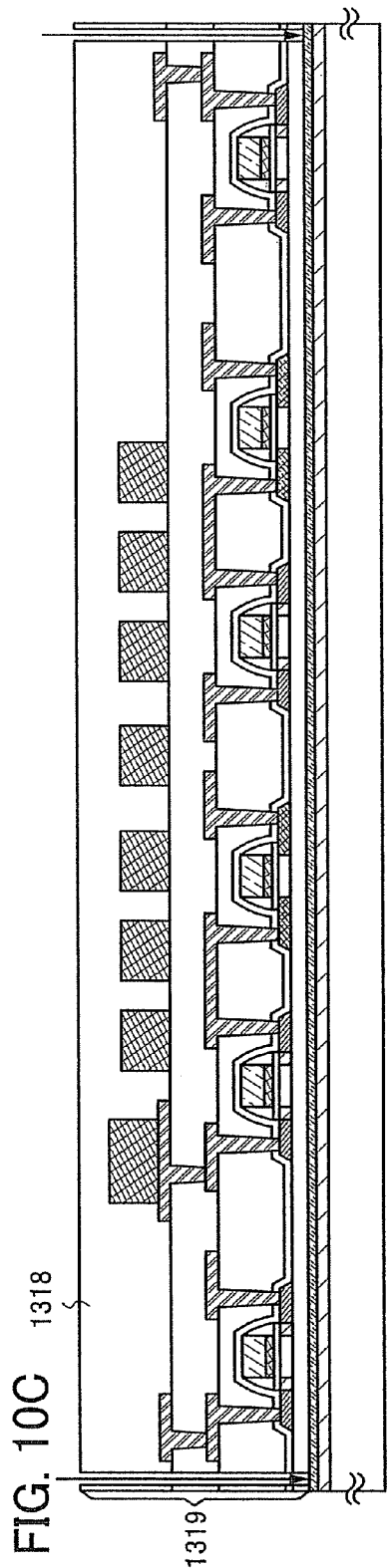

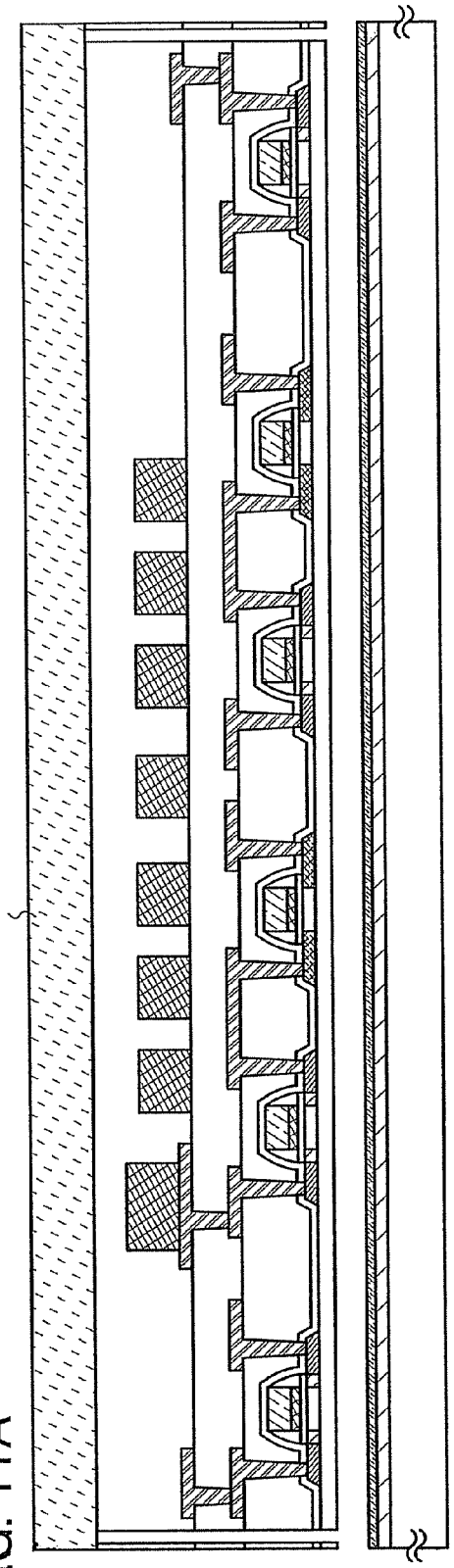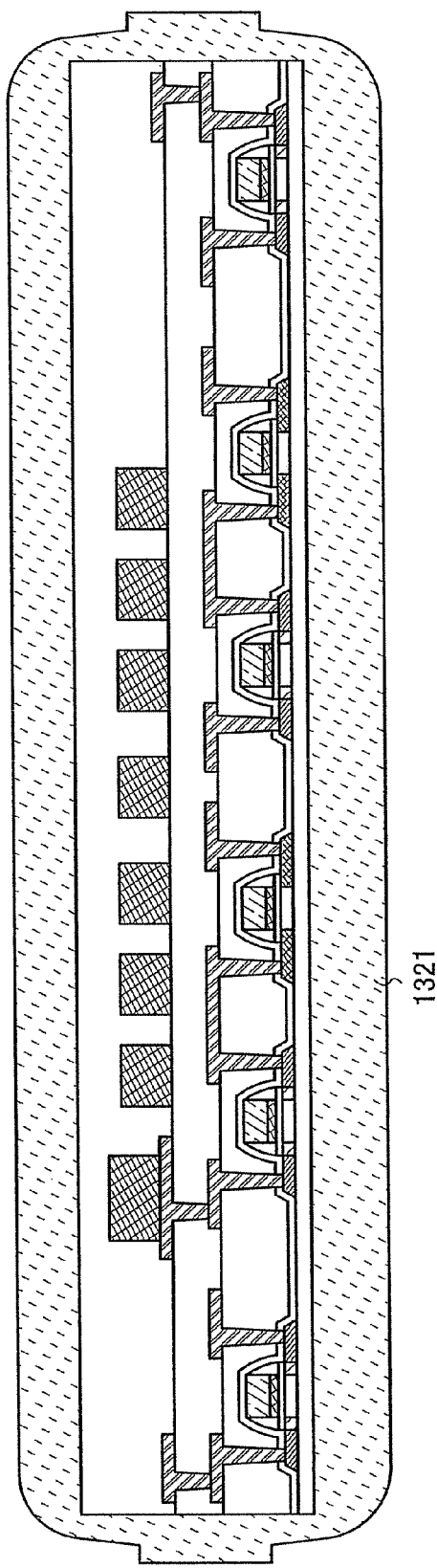
FIG. 11A
FIG. 11B

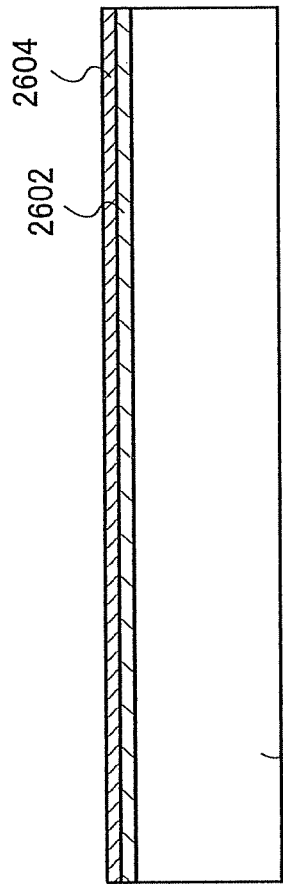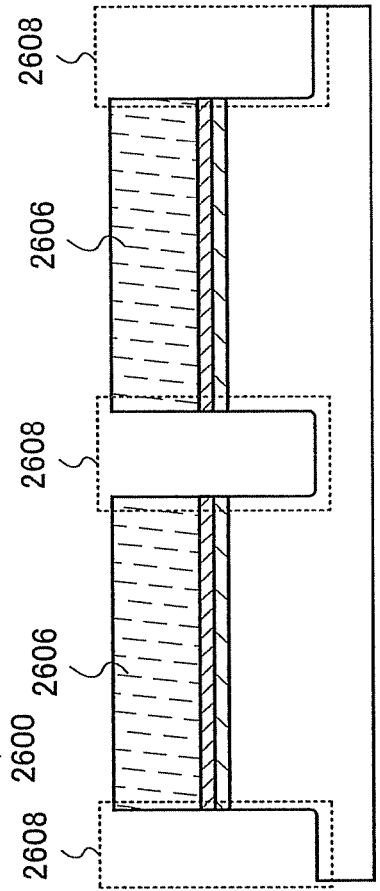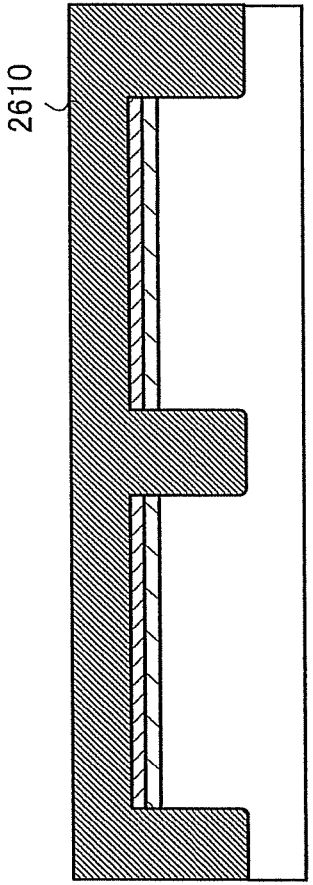

CLOCK GENERATION CIRCUIT AND SEMICONDUCTOR DEVICE INCLUDING THE SAME

This application is a continuation of application Ser. No. 11/845,391 filed on Aug. 27, 2007 now U.S. Pat. No. 8,103,897.

BACKGROUND OF THE INVENTION

1. Field of the Invention

The present invention relates to a clock generation circuit. In particular, the present invention relates to a clock generation circuit which generates a clock signal having the given number of waves in a certain period. The present invention also relates to a semiconductor device including the clock generation circuit.

2. Description of the Related Art

In recent years, semiconductor devices which are capable of transmitting and receiving a signal wirelessly, such as an RFID (Radio Frequency Identification) tag (also referred to as an ID tag, an IC tag, an IC chip, an RF tag, a wireless tag, a wireless chip, or an electronic tag) have been studied and started to be introduced on a trial basis to corporations, markets, and the like (see Patent Document 1: Japanese Published Patent Application No. 2006-196001).

Such a semiconductor device operates based on a signal which is received from a reader/writer. Specifically, a signal outputted from a transmitting circuit provided in the reader/writer is inputted to a receiving circuit provided in the semiconductor device such as an RFID tag.

In general, in the case where signals are transmitted or received between a transmitting circuit provided in a reader/writer or the like which is externally located and a receiving circuit provided in an RFID tag or the like, the signals are transmitted and received using clock signals which differ from circuit to circuit.

SUMMARY OF THE INVENTION

In the case where different clock signals are used between a transmitting circuit and a receiving circuit or among a plurality of circuits, data outputted from circuits is in synchronization with clock signals in the respective circuits. At this time, in the case where signals are transmitted and received between the transmitting circuit and the receiving circuit, there arises a problem such that a change point of a data signal which is inputted from the transmitting circuit to the receiving circuit (also referred to as a reception signal) and a change point of a reference clock signal in the receiving circuit which receives data are different from each other. Therefore, when falling of the reception signal and rising of the reference clock signal in the receiving circuit are synchronized with each other, there arises a problem such that, in a period of time between one falling and the next falling of the reception signal, the duty ratio of the reference clock signal for receiving circuit operation is greatly changed; accordingly, a set-up time and a hold time of a signal do not be constant.

Note that, in this specification, the change in a signal from a low potential to a high potential is referred to as rising, and the change in a signal from a high potential to a low potential is referred to as falling.

The foregoing problem is described below with reference to a drawing. FIG. 5 is a timing chart of the case in which a data signal inputted from a transmitting circuit to a receiving circuit is deviated from a reference clock signal for receiving circuit operation. FIG. 5 illustrates the timing chart of the case in which the duty ratio of the reference clock signal for receiving circuit operation changes substantially and a set-up time and a hold time of data are not constant.

The timing chart in FIG. 5 shows a data signal 501 which is inputted from the transmitting circuit to the receiving circuit, a receiving circuit reference clock signal 502, a reference clock counter signal 503, a reference clock signal 504 for receiving circuit operation, a period 505 in the reference clock signal, and a period 506 in the reference clock signal.

The timing chart in FIG. 5 is described below. The reference clock counter signal counts the number of waves of the receiving circuit reference clock signal 502 since the timing of falling of the data signal 501 which is inputted from transmitting circuit to the receiving circuit. A value obtained by counting the number of waves of the receiving circuit reference clock signal 502 makes a counter value in the reference clock counter signal 503. A signal which is a frequency-divided signal based on the counter value in the reference clock counter signal 503 is outputted as the reference clock signal 504 for receiving circuit operation. At this time, since the data signal 501 which is inputted from the transmitting circuit to the receiving circuit is not synchronized with the receiving circuit reference clock signal 502, the reference clock counter signal 503 is not reset at a certain value. Therefore, the reference clock signal 504 for receiving circuit operation comes to have the period 506 which is an ordinary cycle and the period 505, which is shorter than the ordinary cycle.

Note that the timing chart in FIG. 5 shows the case in which, when the value of the reference clock counter signal changes from an odd number to an even number, a signal is inverted; thereby generating the reference clock signal for receiving circuit operation.

When the period 505, which is a short cycle illustrated in the timing chart in FIG. 5, is generated, there arises a problem such that, a circuit which operates synchronously with the reference clock signal 504 for receiving circuit operation has the set-up time and the hold time which are not constant due to the generation of the period 506 which is an ordinary cycle and the period 505 which is shorter than the ordinary cycle, and a malfunction of the circuit may be caused.

With view of the foregoing, it is an object of the present invention to provide a clock generation circuit, in which, even when different clock signals are used among a plurality of circuits such as a transmitting circuit and a receiving circuit, the duty ratio of the reference clock signal for receiving circuit operation does not change greatly, and a circuit which allows sufficient set-up time and hold time of a signal is designed; thereby enabling stabilized communication. In addition, it is another object of the present invention to provide a semiconductor device including the clock generation circuit.

To achieve the foregoing object, in the present invention, a structure in which edges of a data signal which is inputted from the transmitting circuit to the receiving circuit are detected and the predetermined number of clocks are generated in a period between the edges.

One mode of a clock generation circuit of the present invention includes an edge detection circuit, a reference clock generation circuit, a reference clock counter circuit, and a frequency-divider circuit. The reference clock counter circuit is a circuit which outputs a counter value, which is obtained by counting the number of waves of a reference clock signal outputted from the reference clock generation circuit, in a period of time from when the edge detection circuit detects an edge of a signal which is externally inputted to the edge detection circuit and to when the edge detection circuit detects the next edge, to the frequency-divider circuit. The frequency-divider circuit is a circuit which frequency-divides the reference clock signal based on the counter value.

Another mode of a clock generation circuit of the present invention includes an edge detection circuit, a reference clock generation circuit, a reference clock counter circuit, and a frequency-divider circuit. The edge detection circuit is a circuit which detects an edge of a signal which is externally inputted. The reference clock counter circuit is a circuit which outputs a counter value, which is obtained by counting the number of waves of a reference clock signal outputted from the reference clock generation circuit, in a period of time from when the edge detection circuit detects the edge and to when the edge detection circuit detects the next edge, to the frequency-divider circuit. The frequency-divider circuit is a circuit which frequency-divides the reference clock signal based on the counter value.

Another mode of a clock generation circuit of the present invention includes an edge detection circuit, a reference clock generation circuit, a reference clock counter circuit, and a frequency-divider circuit. The edge detection circuit includes a first latch circuit, a second latch circuit to which a signal outputted from the first latch circuit is inputted, an inverter circuit to which the signal outputted from the first latch circuit is inputted, an AND circuit to which a signal outputted from the second latch circuit and a signal outputted from the inverter circuit are inputted. The AND circuit is a circuit which outputs a reset signal when the signal outputted from the second latch circuit and the signal outputted from the inverter circuit are different. The reference clock counter circuit is a circuit in which a counter value which is obtained by counting the number of waves of a reference clock signal outputted from the reference clock generation circuit is reset by the reset signal, and which outputs the counter value to the frequency-divider circuit. The frequency-divider circuit is a circuit which frequency-divides the reference clock signal based on the counter value.

In the clock generation circuit of the present invention, the reference clock generation circuit may be a ring oscillator or a quartz-crystal oscillator.

In addition, one mode of a semiconductor device of the present invention is a semiconductor device for transmitting and receiving a signal wirelessly with a reader/writer, which is provided with an antenna. The semiconductor device includes an edge detection circuit, a reference clock generation circuit, a reference clock counter circuit, and a frequency-divider circuit. The reference clock counter circuit is a circuit which outputs a counter value, which is obtained by counting the number of waves of a reference clock signal outputted from the reference clock generation circuit, in a period of time from when the edge detection circuit detects an edge of a signal which is inputted from the reader/writer through the antenna to the edge detection circuit to when the edge detection circuit detects the next edge, to the frequency-divider circuit. The frequency-divider circuit is a circuit which frequency-divides the reference clock signal based on the counter value.

Another mode of a semiconductor device of the present invention is a semiconductor device for transmitting and receiving a signal wirelessly with a reader/writer, which is provided with an antenna. The semiconductor device includes an edge detection circuit, a reference clock generation circuit, a reference clock counter circuit, and a frequency-divider circuit. The edge detection circuit is a circuit which detects an edge of a signal inputted from the reader/writer through the antenna. The reference clock counter circuit is a circuit which outputs a counter value, which is obtained by counting the number of waves of a reference clock signal outputted from the reference clock generation circuit, in a period of time from when the edge detection circuit detects the edge to when the edge detection circuit detects the next edge, to the frequency-divider circuit. The frequency-divider circuit is a circuit which frequency-divides the reference clock signal based on the counter value.

Another mode of a semiconductor device of the present invention is a semiconductor device for transmitting and receiving a signal wirelessly with a reader/writer, which is provided with an antenna. The semiconductor device includes an edge detection circuit, a reference clock generation circuit, a reference clock counter circuit, and a frequency-divider circuit. The edge detection circuit includes a first latch circuit, a second latch circuit to which a signal outputted from the first latch circuit is inputted, an inverter circuit to which the signal outputted from the first latch circuit is inputted, and an AND circuit to which a signal outputted from the second latch circuit and a signal outputted from the inverter circuit are inputted. The AND circuit is a circuit which outputs a reset signal when the signal outputted from the second latch circuit and the signal outputted from the inverter circuit are different. The reference clock counter circuit is a circuit in which a counter value which is obtained by counting the number of waves of a reference clock signal outputted from the reference clock generation circuit is reset by the reset signal, and which outputs the counter value to the frequency-divider circuit. The frequency-divider circuit is a circuit which frequency-divides the reference clock signal based on the counter value.

In the semiconductor device of the present invention, the reference clock generation circuit may be a ring oscillator or a quartz-crystal oscillator.

By the present invention, even when different clocks are used between a transmitting circuit and a receiving circuit, or a plurality of circuits, and a clock of the transmitting circuit which outputs a data signal to be inputted from the transmitting circuit to the receiving circuit and a clock of the receiving circuit which receives the data signal are different from each other in transmission and reception of signals between the transmitting circuit and the receiving circuit; the duty ratio of the reference clock signal for receiving circuit operation does not change greatly and a circuit which allows sufficient set-up time and hold time of a signal can be designed. Further, a defect can be reduced, such as malfunctions of circuits because of significant change in set-up time and hold time of a signal. In other words, a clock generation circuit capable of stabilized communication can be provided, even when different clock signals are used among a plurality of circuits such as a receiving circuit and a transmitting circuit.

BRIEF DESCRIPTION OF DRAWINGS

FIGS. 9A to 9D show an example of a manufacturing process of a semiconductor device of the present invention;

FIGS. 10A to 10C show an example of a manufacturing process of a semiconductor device of the present invention;

FIGS. 11A and 11B show an example of a manufacturing process of a semiconductor device of the present invention;

FIGS. 15A to 15C show an example of a manufacturing process of a semiconductor device of the present invention;

DETAILED DESCRIPTION OF THE INVENTION

Figure 1:
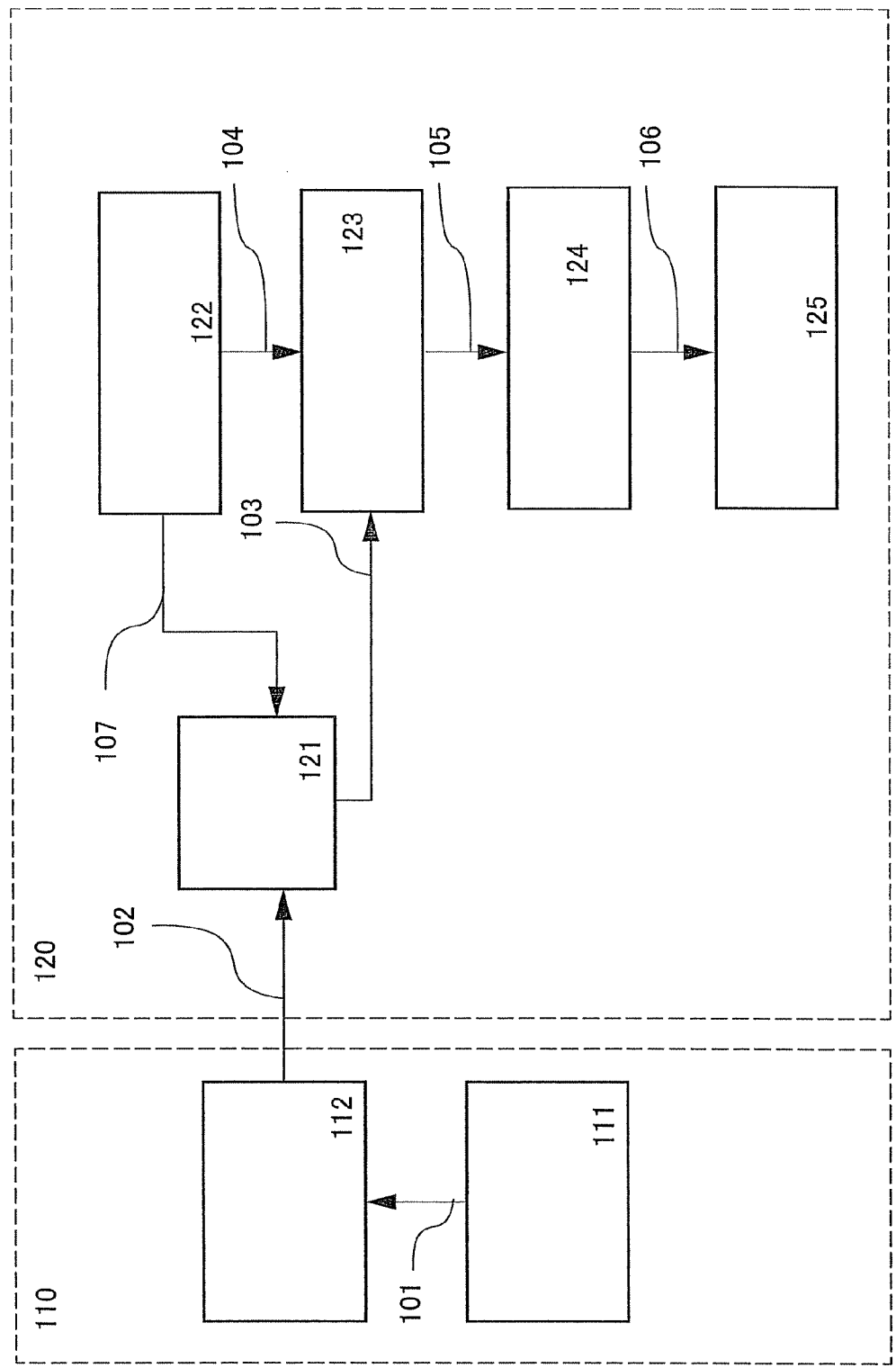
FIG. 1 is an example of a clock generation circuit of the present invention.

Hereinafter, embodiment modes of the present invention are explained with reference to the drawings. However, the present invention is not limited to the following description. It is easy for a person skilled in the art to understand that the mode and the detail of the present invention can be variously changed without departing from the spirit and the scope of the present invention. Thus, the present invention is not interpreted as being limited to the following description of the embodiment modes. Note that like portions in the different drawings may be denoted by the like reference numerals in a structure of the present invention described below.

Embodiment Mode 1

In this embodiment mode, a structural example of a clock generation circuit of the present invention is described with reference to drawings.

A semiconductor device including a clock generation circuit of the present invention includes a circuit detecting an edge of a data signal which is inputted from a transmitting circuit and a receiving circuit, a circuit generating a reference clock for a receiving circuit, a circuit counting the number of waves of the reference clock for the receiving circuit, and a circuit frequency-dividing the reference clock for the receiving circuit based on a counter value of the number of waves of the reference clock for the receiving circuit.

The present invention has an advantageous effect such that, in the case where different clock signals are used between a transmitting circuit and a receiving circuit; even when clock signals used in transmission and reception of signals between the transmitting circuit and the receiving circuit are different, the duty ratio of the clock signal is not changed greatly, so that a circuit which allows sufficient set-up time and hold time of a signal can be designed. The advantageous effect can be realized in the following manner: an edge detector in the receiving circuit detects an edge of a data signal which is inputted from the transmitting circuit to the receiving circuit; a counter circuit counts the number of waves of the reference clock signal for the receiving circuit in a period of time from the edge of the data signal to the next edge of the data signal which is inputted from the transmitting circuit to the receiving circuit; a frequency-divider circuit frequency-divides the reference clock signal for the receiving circuit based on the counter value which is counted; and the signal which has been frequency-divided becomes a reference clock signal for receiving circuit operation. A specific structure and the like are described below.

FIG. 1 shows a block diagram of a receiving circuit 120 which receives a data signal transmitted from a transmitting circuit 110, and the transmitting circuit 110 which transmits the data signal to the receiving circuit 120. The receiving circuit 120 shown in FIG. 1 includes an edge detection circuit 121, a reference clock generation circuit 122 for the receiving circuit, a reference clock counter circuit 123 for the receiving circuit, a frequency-divider circuit 124 for the receiving circuit, and a reference clock generation circuit 125 for receiving circuit operation. The transmitting circuit 110 illustrated in FIG. 1 includes a reference clock generation circuit 111 for the transmitting circuit, and a data signal generation circuit 112 for the transmitting circuit.

In FIG. 1, the edge detection circuit 121 is a circuit which detects a change point (an edge) of a signal 102 which is received. The edge detection circuit includes a combination of a counter circuit, a latch circuit, and decision circuits such as a NOT circuit, an AND circuit, an OR circuit, a NAND circuit, a NOR circuit, an EXOR circuit (an exclusive-or circuit), and an EX-NOR circuit (an exclusive-nor circuit). A specific structure of the edge detection circuit 121 is illustrated in FIG. 4.

Figure 4:
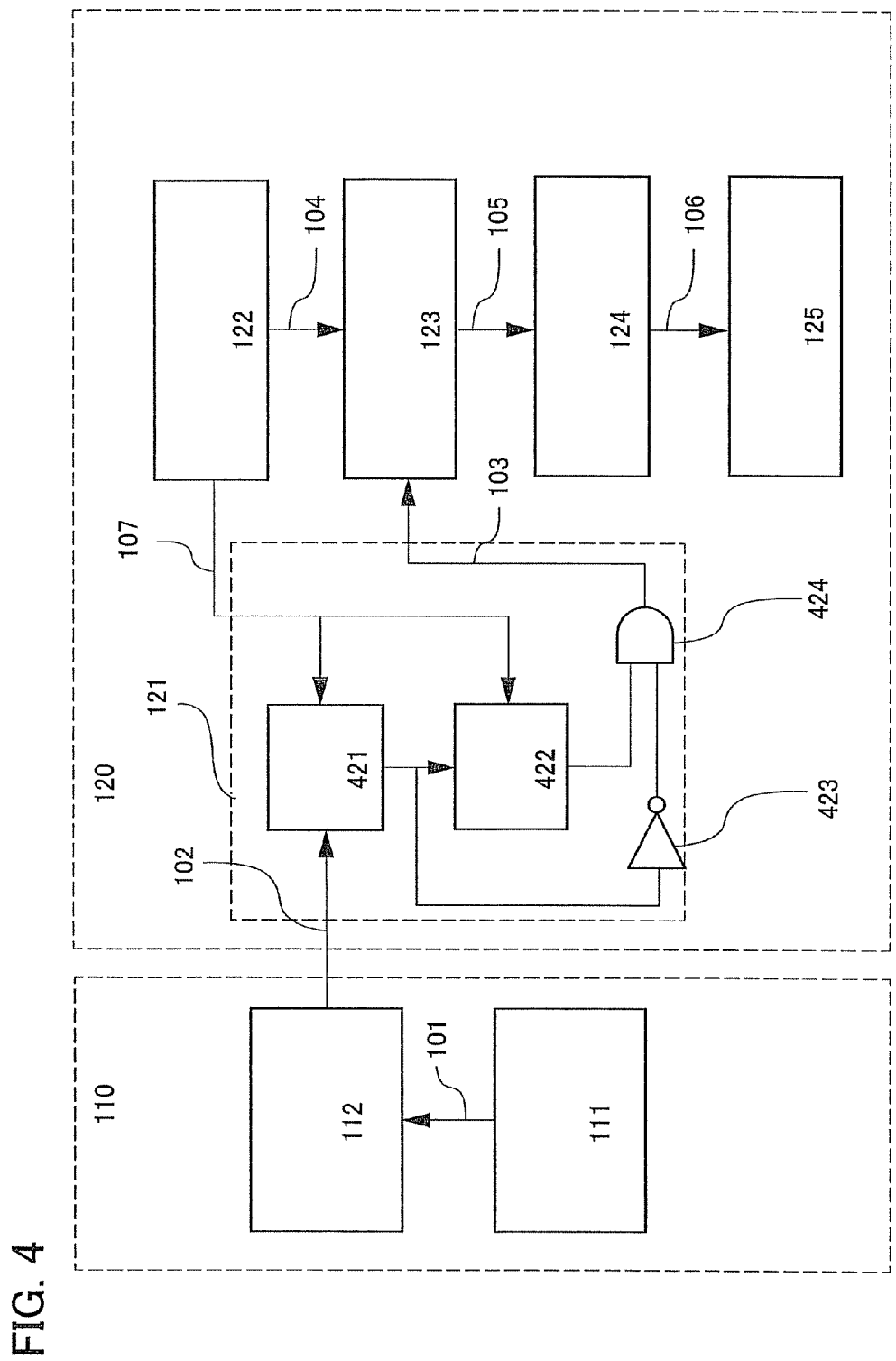
FIG. 4 shows an example of a clock generation circuit of the present invention.
Figure 5:
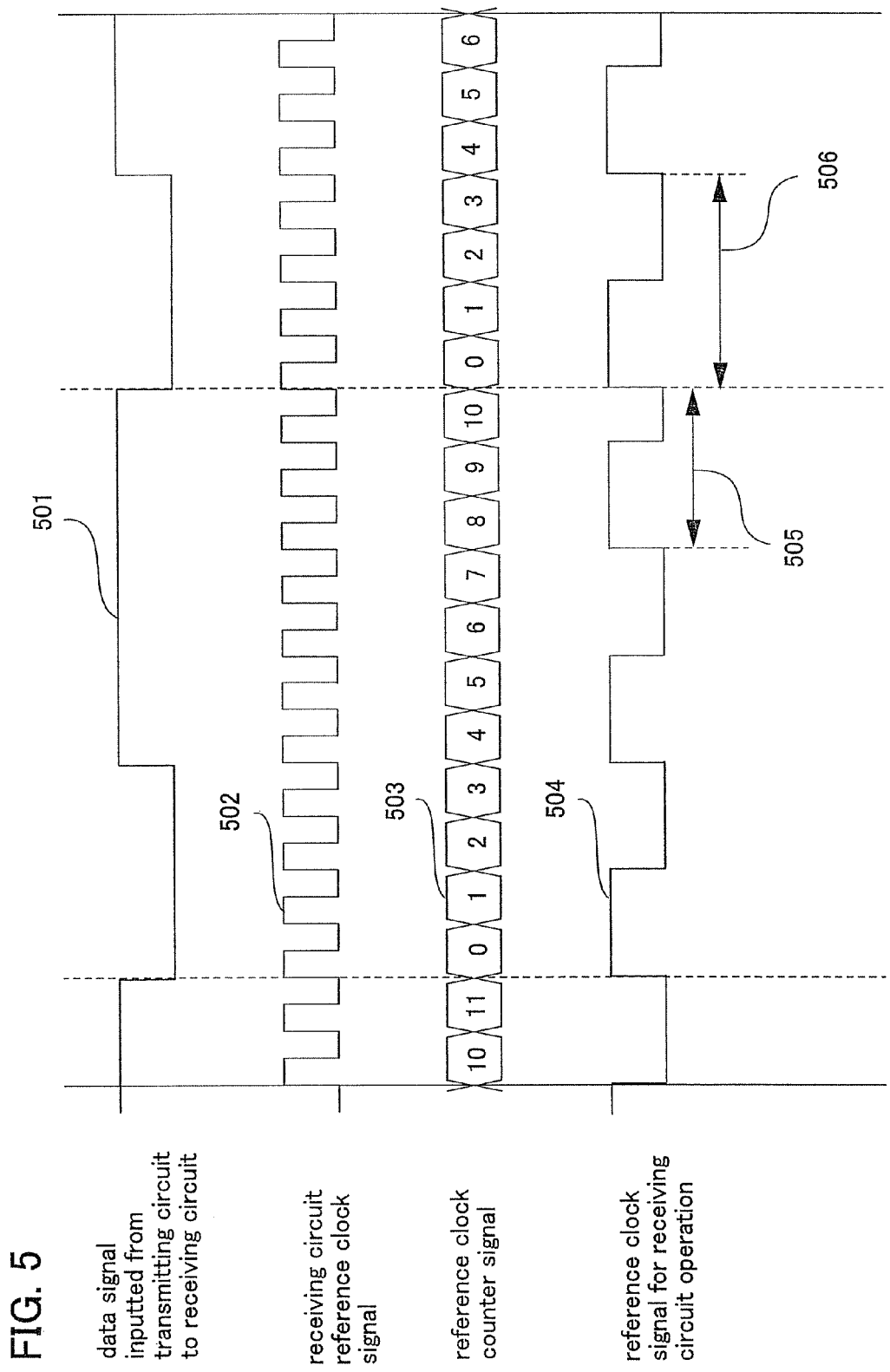
FIG. 5 is a chart for illustrating a conventional problem.
Figure 6A:
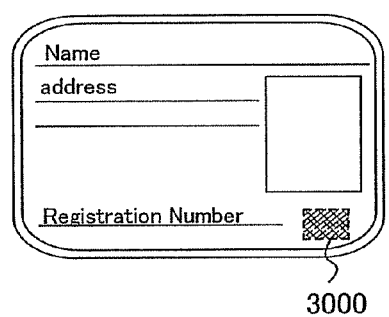
FIGS. 6A to 6F each shows an example of usage of a semiconductor device of the present invention.
Figure 6B:
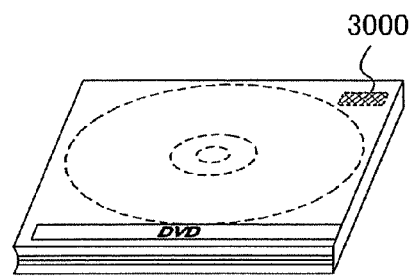
Figure 6C:
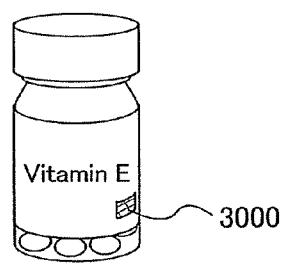
Figure 6D:
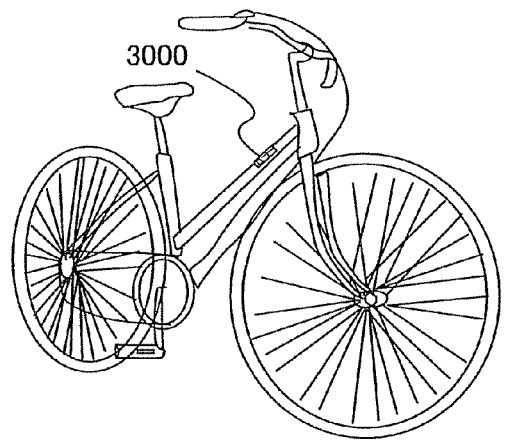
Figure 6E:
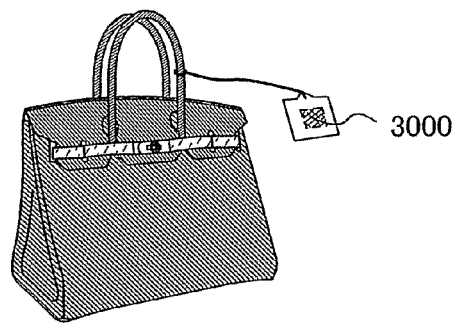
Figure 6F:
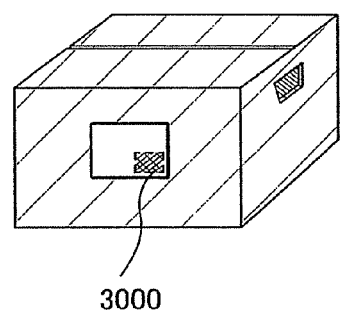

As a specific structure of the edge detection circuit 121 in the block diagram in FIG. 1, FIG. 4 shows an example, in which a first memory unit 421, a second memory unit 422, a unit 423 for generating an inverted signal of the first memory unit 421, and a unit 424 for comparing a signal outputted from the second memory unit 422 and the inverted signal of the first memory unit 421 are provided.

FIG. 4 shows an example in which latch circuits are used as the first memory unit 421 and the second memory unit 422, a NOT circuit is used as the unit 423 for generating the inverted signal of the first memory unit 421, and an AND circuit is used for the unit 424 for comparing the signal outputted from the second memory unit 422 and the inverted signal of the first memory unit 421.

The reference clock generation circuit 122 is a circuit which generates a clock signal which serves as a reference in the receiving circuit 120. The reference clock counter circuit 123 includes a unit for counting the number of waves of the clock signal generated in the reference clock generation circuit 122. In addition, the reference clock counter circuit 123 includes a unit for resetting a counter value which is obtained by counting the number of waves of a clock signal 104 outputted from the reference clock generation circuit 122 based on a signal 103 outputted from the edge detection circuit 121. The frequency-divider circuit 124 is a circuit for frequency-dividing a signal based on a signal 105 which is generated in the reference clock counter circuit 123. The reference clock generation circuit 125 for receiving circuit operation is a circuit for outputting a signal 106, which is frequency-divided in the frequency-divider circuit, as a reference clock signal for operation of the receiving circuit 120.

When the reference clock generation circuit is provided in the clock generation circuit for the receiving circuit, the reference clock can be used independently as the clock signal for receiving circuit operation. Therefore, the whole receiving circuit can be operated by the reference clock, so that the delay time can be easily calculated in designing of the receiving circuit. Accordingly, designing of the circuit can be easy.

FIG. 1 shows the transmitting circuit 110 including the reference clock generation circuit 111 and the data signal generation circuit 112. The transmitting circuit 110 serves as a circuit which generates the signal 102 inputted to the receiving circuit 120 illustrated as the example of a clock generation circuit of the present invention in FIG. 1. The reference clock generation circuit 111 is a circuit which generates a clock signal in the transmitting circuit 110, and the data signal generation circuit 112 is a circuit which generates the signal 102 to be inputted to the receiving circuit 120. That is, each of the receiving circuit 120 and the transmitting circuit 110 includes a circuit which generates a clock signal (here, the reference clock generation circuit 122 in the receiving circuit 120 and the reference clock generation circuit 111 in the transmitting circuit 110). Accordingly, the receiving circuit 120 and the transmitting circuit 110 usually generate different clock signals from each other, and do not operate synchronously.

Note that a signal 101 outputted from the reference clock generation circuit 111 in the transmitting circuit 110 is a clock signal which operates the data signal generation circuit 112, and the signal 102 outputted from the data signal generation circuit 112 is inputted to a circuit in the receiving circuit 120. Note that transmission of the signal 102 from the transmitting circuit 110 to the receiving circuit 120 may be performed via wire or wireless communication. When the signal 102 is transmitted from the transmitting circuit 110 to the receiving circuit 120 via wireless communication, connection by wirings can be omitted.

Note that in the present invention, an edge corresponds to timing of either rising or falling of a signal. Note that, in this specification, the change in a signal from a low potential to a high potential is referred to as rising, and the change in a signal from high potential to a low potential is referred to as falling. That is, a gap between edges corresponds to a period of time from falling to the next falling or a period of time from rising to the next rising.

In the receiving circuit 120, the signal 103 outputted from the edge detection circuit 121 is inputted to the reference clock counter circuit 123. In addition, a signal 107 which is outputted from the reference clock generation circuit 122 in the receiving circuit 120 is inputted to the edge detection circuit 121 as a clock signal for operating the edge detection circuit 121.

Note that, although the frequency-divider circuit 124 is used in the receiving circuit 120, in the case in which frequency of the reference clock counter circuit 123 meets frequency of the reference clock generation circuit 125 for receiving circuit operation, the frequency-divider circuit may output the reference clock reference clock signal from the reference clock generation circuit without frequency-dividing it.

Figure 2:
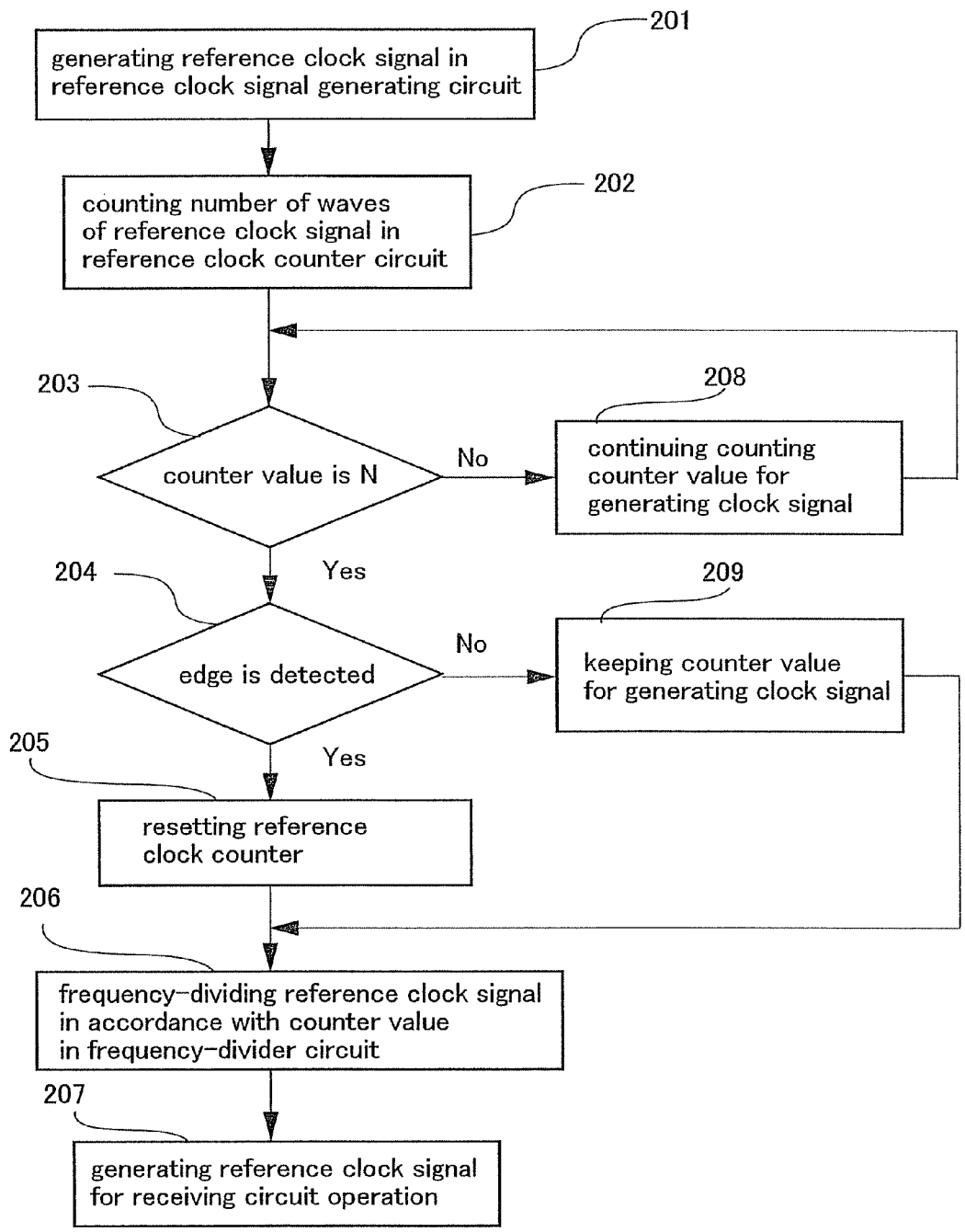
FIG. 2 is a flow chart illustrating operation of a clock generation circuit of the present invention.

Next, an example of operation of circuits in the clock generation circuit shown in this embodiment mode is described with reference to a flow chart in FIG. 2. The flow chart in FIG. 2 illustrates the case in which N pieces of clock signals (N is a natural number) are generated in the period of time from a falling edge to the next falling edge of the data signal which is inputted from the transmitting circuit 110 to the receiving circuit 120, and the N pieces of clock signals in the period of time from the falling edges to the next falling edge of the data signal are used as a reference clock signal for receiving circuit operation.

First, a reference clock signal is generated in the reference clock generation circuit 122 in the receiving circuit 120 (Step 201). Here, the reference clock signal is generated using a ring oscillator as the reference clock generation circuit 122, and the number of waves of the reference clock signal is counted in the reference clock counter circuit 123 (Step 202). Note that, instead of the ring oscillator, a quartz-crystal oscillator or a signal inputted from outside may be used as the reference clock generation circuit 122. When the ring oscillator is used, the reference clock generation circuit 122 can be formed of a thin film transistor, which can lead to reduction in size of the reference clock generation circuit 122.

Then, it is determined whether the counter value, which is the number of waves of the reference clock signal outputted from the reference clock generation circuit 122 counted by the reference clock counter circuit 123 and a certain value (the value N) are the same or not (Step 203). If the counter value and the certain value (the value N) are the same (YES), it is determined whether the falling edge of the data signal, which is inputted from the transmitting circuit to the receiving circuit, is detected by the edge detection circuit 121 or not (Step 204). On the other hand, if the counter value and the certain value (the value N) are not the same (NO), the counter value in the reference clock counter circuit continues counting (Step 208). Then, if the falling edge of the data signal which is inputted from the transmitting circuit 110 to the receiving circuit 120 in the edge detection circuit 121 is detected (YES), the counter value in the reference clock counter circuit is reset in the reference clock counter circuit 123 (Step 205). On the other hand, if the falling edge of the data signal which is inputted from the transmitting circuit 110 to the receiving circuit 120 in the edge detection circuit 121 is not detected (NO), the counter value in the reference clock counter circuit is kept in the reference clock counter circuit 123 (Step 209).

Then, the reference clock signal for the receiving circuit is frequency-divided by the frequency-divider circuit 124 to generate a clock signal having a desired cycle in accordance with the counter value in the reference clock counter circuit (Step 206).

Then, a reference clock generation circuit for receiving circuit operation generates a reference clock for receiving circuit operation based on the reference clock which is frequency-divided in the frequency-divider circuit (Step 207).

Then, a timing chart of the foregoing clock generation circuit is described with reference to FIG. 3.

Figure 3:
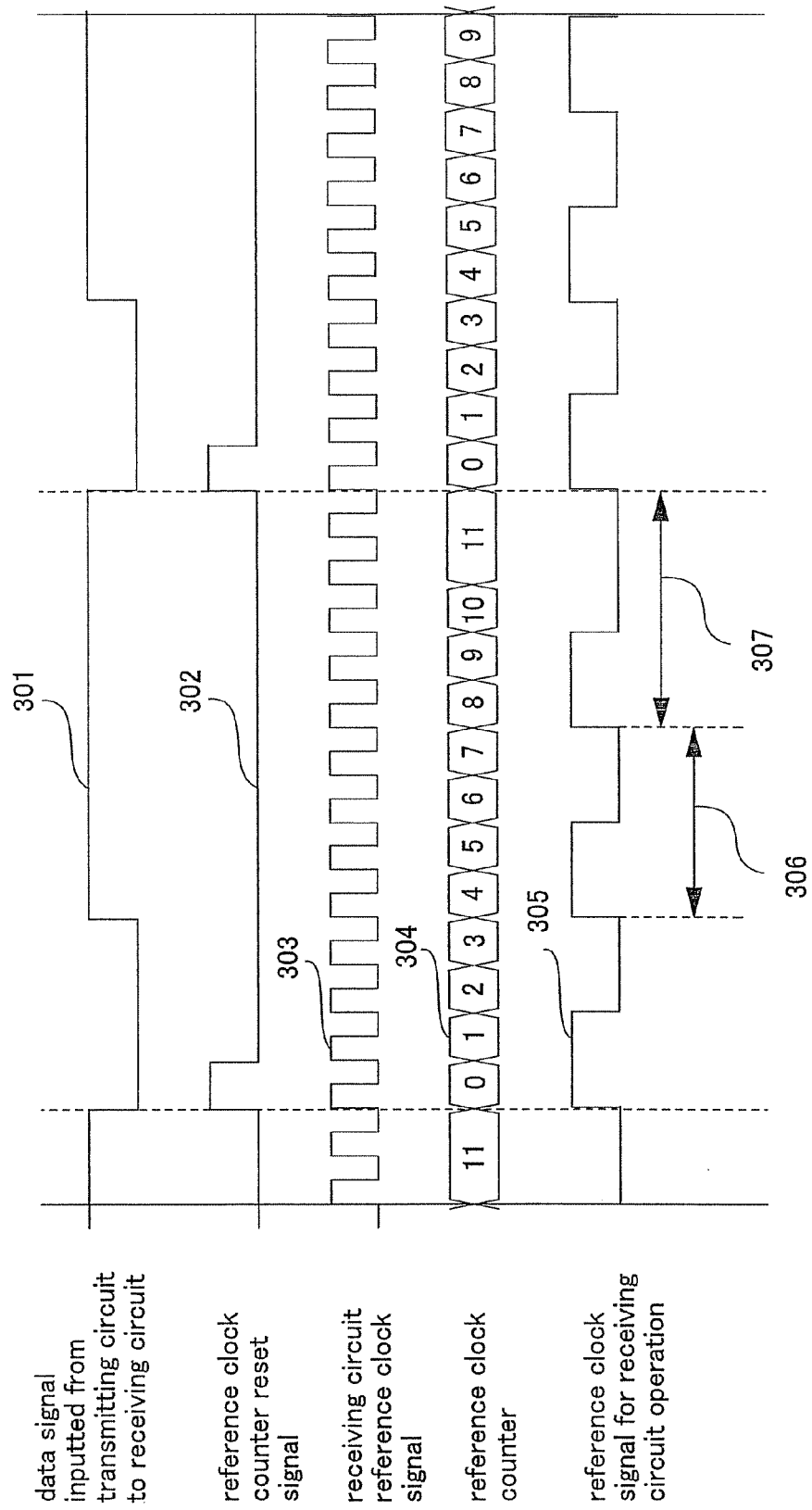
FIG. 3 is a timing chart of a clock generation circuit of the present invention.

The timing chart shown in FIG. 3 illustrates operations of a data signal 301 which is inputted from the transmitting circuit 110 to the receiving circuit 120, a reset signal 302 which detects an edge of the data signal inputted from the transmitting circuit to the receiving circuit and which resets the counter value in the reference clock counter circuit in the receiving circuit, a receiving circuit reference clock signal 303, a counter value 304 in which receiving circuit reference clocks are counted, and a reference clock signal 305 for receiving circuit operation.

In FIG. 3, a period of an ordinary wave and a period which is longer than the ordinary wave in the reference clock signal 305 for receiving circuit operation are illustrated as a period 306 and a period 307, respectively.

In the clock generation circuit in the receiving circuit 120 described in this embodiment mode, a falling edge of the data signal 301, which is inputted from the transmitting circuit 110 to the receiving circuit 120, is detected by the edge detection circuit, so that the reset signal 302, which resets the reference clock counter circuit counting the number of waves in the reference clock in the receiving circuit, is generated. With this reference clock counter reset signal, the counter value in the reference clock counter circuit is reset.

For example, in FIG. 3, when the counter value in the reference clock counter circuit is not equal to "11", the reference clock counter circuit continues counting; on the other hand, when the counter value in the reference clock counter circuit is equal to "11", the counter value in the reference clock counter circuit is kept.

In FIG. 3, a reference clock signal 305 for receiving circuit operation is a reference clock signal for operating the receiving circuit which is frequency-divided based on the counter value in the reference clock counter circuit. In the case in which a clock is inverted when the counter value in the reference clock counter circuit changes from an odd number to an even number, the reference clock signal 305 for receiving circuit operation four-frequency-divides the receiving circuit reference clock signal.

The timing chart shown in FIG. 3 illustrates the case in which the signal is inverted when the counter value in the reference clock counter circuit changes from an odd number to an even number; thereby generating the reference clock signal for receiving circuit operation. Alternatively, the reference clock signal for receiving circuit operation may be generated by inverting the signal when the counter value in the reference clock counter circuit changes from an even number to an odd number. Further alternatively, the signal may be inverted when the counter value is a natural number N, thereby generating the clock signal for receiving circuit operation.

Thus, in the present invention, since the edge detection circuit is provided, even when reference clock generation circuits included in each of the transmitting circuit 110 and the receiving circuit 120 use different clock signals from each other, the whole receiving circuit can operate properly with the reference clock signal for the receiving circuit 120; thereby providing stabile communication. In other words, by the present invention, in the case where different clocks are used between a transmitting circuit and a receiving circuit, and a clock of the transmitting circuit which outputs data to be inputted to the receiving circuit and that of the receiving circuit which receives the data are different in transmission and reception of signals between the transmitting circuit and the receiving circuit, the duty ratio of the clock does not change greatly; accordingly, a circuit which allows sufficient set-up time and hold time of a signal can be designed.

Note that this embodiment mode can be carried out in combination with any technical element in another embodiment mode in this specification.

Embodiment Mode 2

In this embodiment mode, a semiconductor device which includes the clock generation circuit described in the foregoing embodiment mode and which can transmit and receive information wirelessly is described, with reference to drawings.

In recent years, a semiconductor device in which a micro IC chip and an antenna for wireless communication are combined, such as an RFID tag has been spotlighted. An RFID tag can write or read data by transmitting and receiving communication signals (an operation magnetic field) using a wireless communication device (also referred to as a reader/writer).

A semiconductor device capable of transmitting and receiving information wirelessly, such as an RFID tag is applied for, for example, merchandise management in distribution industry. Merchandise management using barcodes or the like is a mainstream at present. Since data of barcodes are read optically, the data cannot be read when there is an interrupting object. On the other hand, as to an RFID tag, since data is read wirelessly, the data can be read even when there is an interrupting object. Accordingly, higher efficiency, lower cost, and the like in merchandise management can be realized. In addition, the semiconductor device can be widely applied to, for example, train tickets, airplane tickets, automatic fare payment, and the like.

As the range of application of an RFID tag expands, the need for an RFID tag with further advanced function is increased. For example, data can be prevented from being leaked to a third party by encoding data to be transmitted or received. Methods of performing decoding/encoding processing using hardware, using software, and using both hardware and software are suggested. In the method of decoding/encoding processing using hardware, an arithmetic circuit includes a circuit dedicated for decoding/encoding. In the method of decoding/encoding processing using software, an arithmetic circuit includes a CPU (Central Processing Unit) and a large capacity memory, and the CPU executes a decoding/encoding program. In the method of decoding/encoding processing using both hardware and software, an arithmetic circuit includes a dedicated circuit, a CPU, and a memory, in which the dedicated circuit performs part of arithmetic processing of decoding/encoding, and the CPU executes other arithmetic processing.

Figure 7:
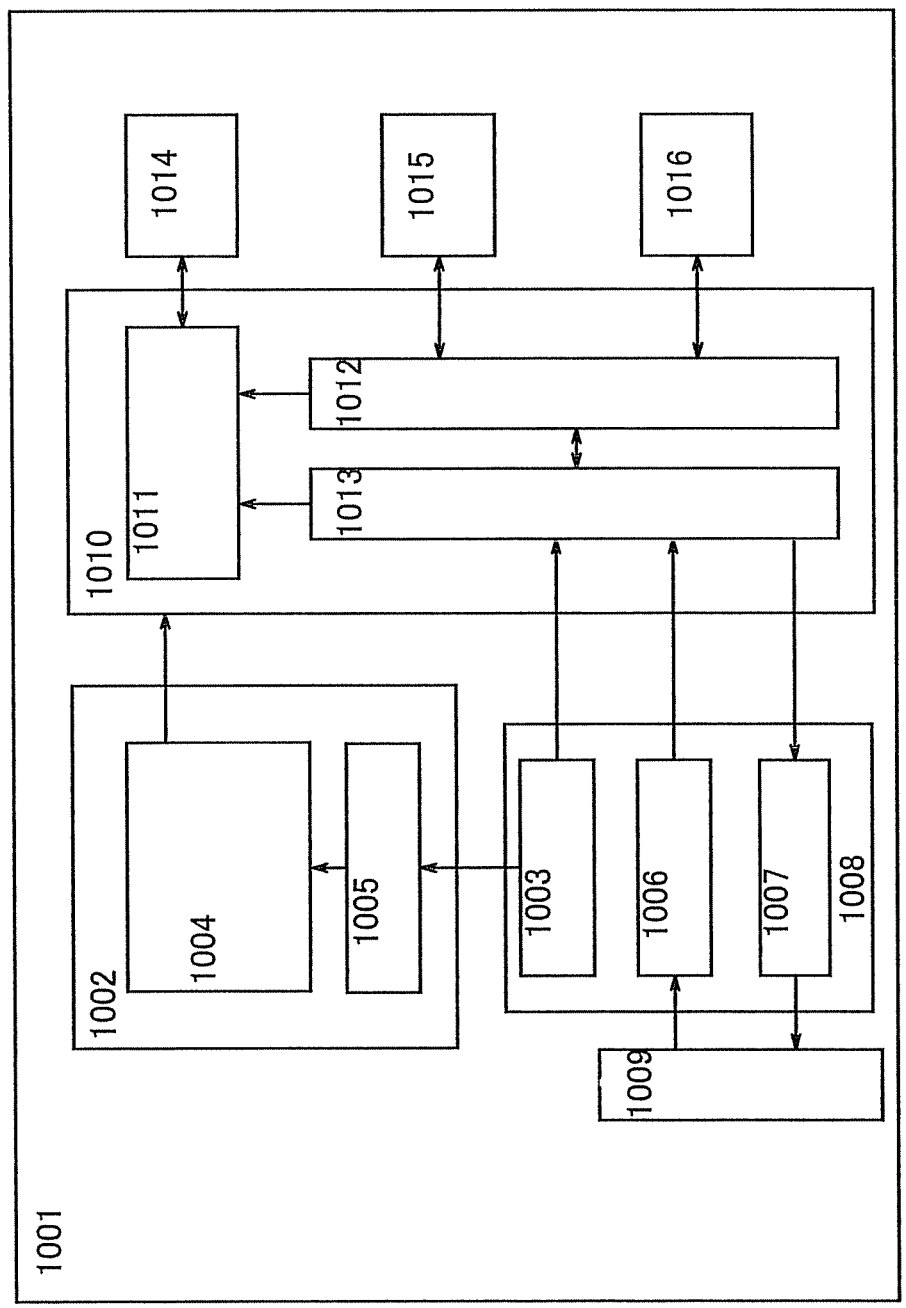
FIG. 7 shows an example of a semiconductor device of the present invention.
Figure 8:
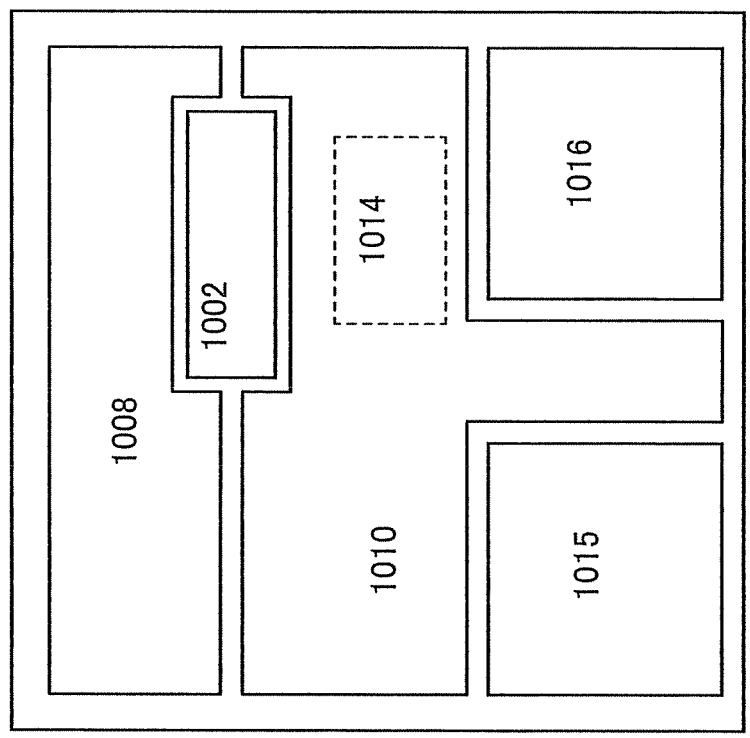
FIG. 8 shows an example of a semiconductor device of the present invention.

In this embodiment mode, an RFID tag including a CPU and a memory is described as an example of a semiconductor device of the present invention, with reference to FIGS. 7 and 8. FIG. 7 is a block diagram of the RFID tag, and FIG. 8 is a layout diagram of the RFID tag.

First, a block structure of the semiconductor device shown in this embodiment mode is described with reference to FIG. 7. In FIG. 7, the semiconductor device (hereinafter referred to as an RFID tag 1001) such as an RFID tag includes an antenna 1009, an RF circuit 1008, a clock generation portion 1002, a controller 1010, a CPU 1014, a ROM 1015, and a RAM 1016. The RF circuit 1008 includes a power supply circuit 1003, a demodulation circuit 1006, and a modulation circuit 1007. The clock generation portion 1002 includes a clock generation circuit 1004 and a regulator 1005. The controller 1010 includes a CPU interface 1011, an RF interface 1013, and a memory controller 1012. Note that, in FIG. 7, although not illustrated for simplification, a reception signal and transmission signal are received and transmitted at the same time between the RFID tag 1001 and a reader/writer. The reception signal is received by the antenna 1009, and then demodulated by the demodulation circuit 1006. The transmission signal is modulated by the modulation circuit 1007, and then transmitted from the antenna 1009. Note that the clock generation circuit 1004 can have the structure shown in the forgoing embodiment mode.

In FIG. 7, when the RFID tag 1001 is set in a magnetic field formed by a communication signal, an induced electromotive force is generated by the antenna 1009. The induced electromotive force is inputted to the regulator 1005 and the RF interface 1013 through the power supply circuit 1003 in the RF circuit 1008. Voltage inputted to the regulator 1005 is stabilized and inputted to the clock generation circuit 1004, whereby the clock generation circuit outputs a stabilized clock signal. The clock signal is inputted to the controller. Note that, in FIG. 7, a structure in which the clock generation circuit 1004 and the regulator 1005 are provided side by side is preferable. In particular, in the present invention, a stabilized clock needs to be generated in the reference clock generation circuit using a ring oscillator or the like, and a more stabilized clock signal can be generated when both the regulator 1005 and the clock generation circuit 1004 are provided.

The demodulation circuit 1006 detects a change of the amplitude of the reception signal which is ASK modulated, as reception data of "0"/"1". The demodulation circuit 1006 is, for example, a low pass filter. The modulation circuit 1007 transmits transmission data using an ASK modulated transmission signal in which the amplitude is changed. For example; when the transmission data is "0", the point of resonance of the resonant circuit is changed to change the amplitude of the communication signal.

An operation of the RFID tag of this embodiment mode is described. First, the reception signal which is transmitted from the reader/writer is received by the RFID tag 1001. The reception signal is demodulated in the demodulation circuit 1006, and then, is inputted to the RF interface 1013 in the controller 1010. The reception signal inputted to the RF interface 1013 is arithmetically processed by the CPU 1014 through the CPU interface 1011. In addition, by the reception signal which is inputted to the RF interface 1013, access to the ROM 1015 and the RAM 1016 through the memory controller 1012 is performed.

Then, after the arithmetic processing by the CPU 1014 and data input and output to and from the ROM 1015 and the RAM 1016, the transmission data is generated and modulated by the modulation circuit 1007. Then, the transmission signal is transmitted to the reader/writer from the antenna 1009.

Note that this embodiment mode has described a method in which the arithmetic circuit includes the CPU and the large capacity memory and a program is executed by the CPU; however, it is also possible to select the optimum arithmetic method in accordance with the purpose and to form the arithmetic circuit based on the selected method. For example, as other arithmetic methods, methods of performing an arithmetic using hardware and using both hardware and software are suggested. In the method of processing the arithmetic using hardware, an arithmetic circuit may include a dedicated circuit. In the method of processing the arithmetic using both hardware and software, an arithmetic circuit may include a dedicated circuit, a CPU, and a memory, and the dedicated circuit may perform part of arithmetic processing, and the CPU may execute other part of the arithmetic processing.

Next, a layout structure of the RFID tag 1001 is described with reference to FIG. 8. Note that, in FIG. 8, the same portions as those in FIG. 7 are denoted by the same reference numerals and description thereof is omitted.

In FIG. 8, the RF circuit 1008 has an electrode pad to which an antenna (not shown) is attached. Note that when the antenna is attached, excess pressure may be applied to the electrode pad. Therefore, it is preferable that a component for forming a circuit, such as a transistor, is not placed under the electrode pad. Note that the antenna is not limited to a specific kind, for example, a V-shaped dipole antenna may be externally provided.

Note that this embodiment mode can be carried out in combination with a technical element in another embodiment mode in this specification. In other words, in addition to an advantage described in this embodiment mode, such that a clock signal can be stabilized and outputted from a clock generation circuit; even when different clocks are used between a transmitting circuit and a receiving circuit, and a clock of the transmitting circuit which outputs data to be inputted to the receiving circuit and that of the receiving circuit which receives the data are different in transmission and reception of signals between the transmitting circuit and the receiving circuit, the duty ratio of the clock does not change greatly; accordingly, a circuit which allows sufficient set-up time and hold time of a signal can be designed.

Embodiment Mode 3

In this embodiment mode, a manufacturing method of an element for forming a semiconductor device such as an RFID tag described in the above embodiment modes is described. A circuit for forming a semiconductor device of the present invention can be formed using a thin film transistor as an element thereof. In this embodiment mode, a method for manufacturing a flexible semiconductor device is shown, in which a circuit forming a semiconductor device is formed using a thin film transistor, and the circuit is transferred from a substrate used for forming the thin film transistor to a flexible substrate.

In this embodiment mode, as a circuit for forming a semiconductor device, a p-channel TFT (also referred to as a pch-TFT) and an n-channel TFT (also referred to as an nch-TFT) for forming an inverter or the like, and an antenna are shown as typical examples. Hereinafter, a manufacturing method of a semiconductor device is described with reference to cross-sectional views in FIGS. 9A to 11B.

First, a separation layer 1303 is formed on one surface of a substrate 1301 with an insulating film 1302 therebetween. Subsequently, an insulating film 1304 which serves as a base film, and a semiconductor film (an amorphous semiconductor film 1305) are formed so as to be stacked (see FIG. 9A). Note that the insulating film 1302, the separation layer 1303, the insulating film 1304, and the amorphous semiconductor film 1305 can be formed continuously.

The substrate 1301 is selected from a glass substrate, a quartz substrate, a metal substrate (such as a stainless steel substrate), a ceramic substrate, a semiconductor substrate such as a Si substrate, and the like. In addition, as a plastic substrate, a substrate of polyethylene terephthalate (PET), polyethylene naphthalate (PEN), polyether sulfone (PES), acrylic, or the like can be selected. Note that, although the separation layer 1303 is formed over the entire surface of the substrate 1301 with the insulating film 1302 therebetween in this process, the separation layer may be selectively provided by a photolithography method after forming the separation layer over the entire surface of the substrate 1301, if necessary.

The insulating film 1302 and the insulating film 1304 are formed of an insulating material such as silicon oxide, silicon nitride, silicon oxynitride ($SiO_xN_y$) (x>y>0), or silicon nitride oxide ($SiN_xO_y$) (x>y>0), by a CVD method, a sputtering method, or the like. For example, when the insulating films 1302 and 1304 have two-layer structures, a silicon nitride oxide film may be formed as a first insulating film and a silicon oxynitride film may be formed as a second insulating film. Alternatively, a silicon nitride film may be formed as the first insulating film and a silicon oxide film may be formed as the second insulating film. The insulating film 1302 serves as a blocking layer which prevents an impurity element from being mixed into the separation layer 1303 or into an element formed thereover from the substrate 1301. The insulating film 1304 serves as a blocking layer which prevents an impurity element from being mixed into an element formed over the insulating film 1304 from the substrate 1301 and the separation layer 1303. Thus, by forming the insulating films 1302 and 1304 which serve as the blocking layers, it is possible to prevent alkali metal such as Na or alkaline earth metal from the substrate 1301, or an impurity element contained in the separation layer 1303 from adversely affecting the element formed over the insulating films. Note that, when quartz is used for the substrate 1301, the insulating films 1302 and 1304 may be omitted.

As the separation layer 1303, a metal film, a stacked-layer structure including a metal film and a metal oxide film, or the like can be used. The metal film is formed of a single layer or a stacked layer of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing any of the foregoing elements as its main component. The metal film and the metal oxide film can be formed by using any of these materials by a sputtering method, various CVD methods such as a plasma CVD method, or the like. As for the stacked-layer structure including the metal film and the metal oxide film, after the foregoing metal film is formed, a plasma treatment in an oxygen atmosphere or a $N_2O$ atmosphere, or a heat treatment in an oxygen atmosphere or a $N_2O$ atmosphere is performed, whereby an oxide or oxynitride of the metal film can be provided on a surface of the metal film. For example, when a tungsten film is provided by a sputtering method, a CVD method, or the like as the metal film, a plasma treatment is performed on the tungsten film, so that a metal oxide film formed of tungsten oxide can be formed on a surface of the tungsten film. In addition, in this case, an oxide of tungsten is expressed by $WO_x$, where X is 2 to 3. There are cases where x is 2 ($WO_2$), x is 2.5 ($W_2O_5$), x is 2.75 ($W_4O_{11}$), x is 3 ($WO_3$), and the like. In formation of an oxide of tungsten, the value of x described above is not specifically limited and an oxide to be formed may be decided based on etching rate or the like. Alternatively, for example, a metal film (such as tungsten) may be formed, then, an insulating film of silicon oxide ($SiO_2$) or the like may be formed over the metal film by a sputtering method, so that a metal oxide (such as tungsten oxide over tungsten) is also formed on the metal film. Further, metal nitride or metal oxynitride may be used instead of the metal oxide film. In this case, a plasma treatment or a heat treatment may be performed in an oxygen atmosphere or an atmosphere containing nitrogen and oxygen on the metal film.

The amorphous semiconductor film 1305 is formed by a sputtering method, an LPCVD method, a plasma CVD method, or the like to have a thickness of 25 to 200 nm (preferably, 30 to 150 nm).

Then, the amorphous semiconductor film 1305 is crystallized by being irradiated with laser light. Note that the amorphous semiconductor film 1305 may be crystallized by a method or the like in which laser light irradiation is combined with a thermal crystallization method using an RTA or an annealing furnace, or a thermal crystallization method using a metal element for promoting crystallization. Then, the obtained crystalline semiconductor film is etched to have desired shapes in order to form crystalline semiconductor films 1305a to 1305f. A gate insulating film 1306 is formed so as to cover the semiconductor films 1305a to 1305f (see FIG. 9B).

The gate insulating film 1306 is formed of an insulating material such as silicon oxide, silicon nitride, silicon oxynitride ($SiO_xN_y$) (x>y>0), or silicon nitride oxide ($SiN_xO_y$) (x>y>0), by a CVD method, a sputtering method, or the like. When the gate insulating film 1306 has a two-layer structure, a silicon oxynitride film may be formed as a first insulating film and a silicon nitride oxide film may be formed as a second insulating film. Alternatively, a silicon oxide film may be formed as the first insulating film and a silicon nitride film may be formed as the second insulating film.

An example of a manufacturing process of the crystalline semiconductor films 1305a to 1305f is briefly described below. First, an amorphous semiconductor film is formed by a plasma CVD method to have a thickness of 50 to 60 nm. Then, a solution containing nickel, which is a metal element for promoting crystallization, is held over the amorphous semiconductor film, and a dehydrogenation treatment (at 500° C., for one hour) and a thermal crystallization treatment (at 550° C., for four hours) are performed on the amorphous semiconductor film; thereby forming a crystalline semiconductor film. After that, the crystalline semiconductor film is irradiated with laser light and a photolithography method is used, so that the crystalline semiconductor films 1305a to 1305f are formed. Note that, without conducting thermal crystallization using a metal element for promoting crystallization, the amorphous semiconductor film may be crystallized only by laser light irradiation.

For a laser oscillator used for crystallization, a continuous wave laser beam (a CW laser beam) or a pulsed wave laser beam (a pulsed laser beam) can be used. As a laser beam which can be used here, a laser beam emitted from one or more of the following can be used: a gas laser such as an Ar laser, a Kr laser, or an excimer laser; a laser of which a medium is single crystalline YAG, $YVO_4$, forsterite ($Mg_2SiO_4$), $YAlO_3$, $GdVO_4$, or polycrystalline (ceramic) YAC, $Y_2O_3$, $YVO_4$, $YAlO_3$, or $GdVO_4$, to which one or more of Nd, Yb, Cr, Ti, Ho, Er, Tm, and Ta are added as a dopant; a glass laser; a ruby laser; an alexandrite laser; a Ti:sapphire laser; a copper vapor laser; and a gold vapor laser. Crystals with a large grain size can be obtained by irradiation of fundamental waves of such laser beams or second to fourth harmonics of the fundamental waves of such laser beams. For example, the second harmonic (532 nm) or the third harmonic (355 nm) of an Nd:$YVO_4$ laser (fundamental wave: 1064 nm) can be used. A power density of the laser at this time needs to be about 0.01 to 100 $MW/cm^2$ (preferably, 0.1 to 10 $MW/cm^2$). The scanning rate is set to be about 10 to 2000 cm/sec for the irradiation. Note that a laser using, as a medium, single crystalline YAG, $YVO_4$, forsterite ($Mg_2SiO_4$), $YAlO_3$, or $GdVO_4$ or polycrystalline (ceramic) YAG $Y_2O_3$, $YVO_4$, $YAlO_3$, or $GdVO_4$ to which one or more of Nd, Yb, Cr, Ti, Ho, Er, Tm, and Ta are added as a dopant; an Ar ion laser; or a Ti:sapphire laser can be continuously oscillated. Furthermore, pulse oscillation thereof can be performed with a repetition rate of 10 MHz or more by carrying out a Q-switch operation, mode locking, or the like. In the case where a laser beam is oscillated with a reputation rate of greater than or equal to 10 MHz, the semiconductor film is irradiated with a next pulse after the semiconductor film is melted by the laser and before it is solidified. Therefore, unlike the case of using a pulsed laser with a low repetition rate, a solid-liquid interface can be continuously moved in the semiconductor film, so that crystal grains which grow continuously in a scanning direction can be obtained.

Alternatively, the gate insulating film 1306 may be formed by oxidizing or nitriding the surfaces of the semiconductor films 1305a to 1305f by performing the foregoing high-density plasma treatment. For example, the gate insulating film 1306 is formed by a plasma treatment in which a mixed gas of a rare gas such as He, Ar, Kr, or Xe and oxygen, nitrogen oxide, ammonia, nitrogen, hydrogen or the like is introduced. When excitation of the plasma in this case is performed by introduction of a microwave, plasma with a low electron temperature and a high density can be generated. The surfaces of the semiconductor films can be oxidized or nitrided by oxygen radicals (which may include OH radicals) or nitrogen radicals (which may include NH radicals) generated by this high-density plasma.

By the treatment using such high-density plasma, an insulating film is formed over the semiconductor films to have a thickness of 1 to 20 nm, typically 5 to 10 nm. Since the reaction in this case is a solid-phase reaction, interface state density between the insulating film and the semiconductor film can be extremely low. Such a high-density plasma treatment oxidizes (or nitrides) a semiconductor film (crystalline silicon, or polycrystalline silicon) directly, variation in thickness of the formed insulating film can be extremely small, ideally. Further, oxidation is not performed excessively even in a crystal grain boundary of crystalline silicon, which makes a very preferable condition. In other words, by solid-phase oxidation of the surface of the semiconductor film by the high-density plasma treatment shown here, an insulating film with good uniformity and low interface state density can be formed without causing oxidation reaction abnormally in a crystal grain boundary.

As the gate insulating film, an insulating film formed by a high-density plasma treatment may only be used, or an insulating film of silicon oxide, silicon oxynitride, silicon nitride, or the like may be deposited to be stacked by a CVD method utilizing a plasma or thermal reaction. In any case, transistors including insulating films formed by high-density plasma as a part of gate insulating films or as the gate insulating films can have less variation in characteristics.

Further, the semiconductor films 1305a to 1305f, which are obtained by scanning in one direction to be crystallized while the semiconductor films are irradiated with a laser beam oscillated by a continuous wave laser or with a repetition rate of greater than or equal to 10 MHz, have characteristics such that the crystal grows in the scanning direction of the beam. When transistors are arranged so that the scanning direction corresponds to a channel length direction (a direction in which carriers flow when a channel formation region is formed) and the foregoing gate insulating film is combined therewith, thin film transistors (TFTs) with less characteristic variation and high field effect mobility can be obtained.

Next, a first conductive film and a second conductive film are formed and stacked over the gate insulating film 1306. Here, the first conductive film is formed by a CVD method, a sputtering method, or the like to have a thickness of 20 to 100 nm. The second conductive film is formed to have a thickness of 100 to 400 nm. The first and the second conductive films are formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the foregoing elements as its main component. Alternatively, the first and the second conductive films are formed of a semiconductor material typified by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten or tungsten nitride have high heat resistance, a heat treatment for thermal activation can be performed after the formation of the first and the second conductive films. In addition, in the case of a three-layer structure instead of a two-layer structure, a stacked-layer structure including a molybdenum film, an aluminum film, and a molybdenum film may be employed.

Next, a mask formed of a resist is formed by a photolithography method, and an etching treatment is performed for forming a gate electrode and a gate wiring, thereby forming gate electrodes 1307 over the semiconductor films 1305a to 1305f. Here, an example in which the gate electrode 1307 has a stacked-layer structure including a first conductive film 1307a and a second conductive film 1307b is shown.

Next, the semiconductor films 1305a to 1305f are doped with an impurity element imparting n-type conductivity at low concentration by an ion doping method or an ion implantation method with the use of the gate electrodes 1307 as masks. Then, a mask formed of a resist is formed selectively by a photolithography method, and an impurity element imparting p-type conductivity is added at high concentration. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element imparting n-type conductivity and is selectively introduced into the semiconductor films 1305a to 1305f so as to be contained at a concentration of $1 \times 10^{15}$ to $1 \times 10^{19}/cm^3$; thus, n-type impurity regions 1308 are formed. Thus, boron (B) is used as the impurity element imparting p-type conductivity and is selectively introduced into the semiconductor films 1305c and 1305e so as to be contained at a concentration of $1 \times 10^{19}$ to $1 \times 10^{20}/cm^3$; thus, p-type impurity regions 1309 are formed (see FIG. 9C).

Next, an insulating film is formed so as to cover the gate insulating film 1306 and the gate electrode 1307. The insulating film is formed by a single layer or a stacked layer of a film containing an inorganic material such as silicon, oxide of silicon, or nitride of silicon, or containing an organic material such as an organic resin, by a plasma CVD method, a sputtering method, or the like. Then, the insulating film is selectively etched by anisotropic etching which etches mainly in a vertical direction, so that insulating films 1310 (also referred to as side walls) which are in contact with side surfaces of the gate electrode 1307 are formed. The insulating films 1310 are used as masks in doping for forming lightly doped drain (LDD) regions.

Next, the semiconductor films 1305a, 1305b, 1305d, and 1305f are doped with an impurity element imparting n-type conductivity at high concentration with the use of a mask formed of a resist by a photolithography method, the gate electrode 1307, and the insulating films 1310 as masks, thereby forming n-type impurity regions 1311. Here, phosphorus (P) is used as the impurity element imparting n-type conductivity and is selectively introduced into the semiconductor films 1305a, 1305b, 1305d, and 1305f so as to be contained at a concentration of $1 \times 10^{19}$ to $1 \times 10^{20}/cm^3$; thus, n-type impurity regions 1311 which have a higher concentration than the impurity regions 1308 are formed.

By the foregoing steps, n-channel thin film transistors 1300a, 1300b, 1300d, and 1300f, and p-channel thin film transistors 1300c and 1300e are formed (see FIG. 9D).

In the n-channel thin film transistor 1300a, a channel formation region is formed in a region in the semiconductor film 1305a which overlaps with the gate electrode 1307, the impurity region 1311 forming a source region or a drain region is formed in a region which is not overlapped with the gate electrode 1307 and the insulating film 1310, and a lightly doped drain region (LDD region) is formed in a region which is overlapped with the insulating film 1310 and which is between the channel formation region and the impurity region 1311. Also in each of the n-channel thin film transistors 1300b, 1300d, and 1300f, a channel formation region, a lightly doped drain region, and the impurity region 1311 are formed in a similar manner.

In the p-channel thin film transistor 1300c, a channel formation region is formed in a region in the semiconductor film 1305c which overlaps with the gate electrode 1307, and the impurity region 1309 forming a source region or a drain region is formed in a region which is not overlapped with the gate electrode 1307. Also in the p-channel thin film transistor 1300e, a channel formation region and the impurity region 1309 are formed in a similar manner. Note that an LDD region is not provided in the p-channel thin film transistors 1300c and 1300e, but the LDD region may be provided in the p-channel thin film transistor or the LDD region is not necessarily provided in the n-channel thin film transistor.

Next, a single layer or a stacked layer of an insulating film is formed so as to cover the semiconductor films 1305a to 1305f, the gate electrode 1307, and the like. A conductive films 1313 which are electrically connected to the impurity regions 1309 and 1311 which form source regions or drain regions in the thin film transistors 1300a to 1300f are formed over the insulating film (see FIG. 10A). The insulating film is formed of a single layer or a stacked layer of an inorganic material such as oxide of silicon or nitride of silicon, an organic material such as polyimide, polyamide, benzocyclobutene, acrylic, or epoxy, a siloxane material, or the like, by a CVD method, a sputtering method, an SOG method, a droplet discharging method, a screen printing method, or the like. Here, the insulating film has a two-layer structure, in which a silicon nitride oxide film is formed as a first insulating film 1312a, and a silicon oxynitride film is formed as a second insulating film 1312b. In addition, the conductive films 1313 can form source electrodes or drain electrodes of the thin film transistors 1300a to 1300f.

Note that, before the insulating films 1312a and 1312b are formed or after one or more of thin films of the insulating films 1312a and 1312b are formed, a heat treatment for recovering the crystallinity of the semiconductor film, for activating the impurity elements which are added into the semiconductor film, or for hydrogenating the semiconductor film may be performed. As this heat treatment, thermal annealing, a laser annealing method, an RTA method, or the like may be employed.

The conductive film 1313 is formed of a single layer or a stacked layer of an element selected from, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the foregoing elements as its main component by a CVD method, a sputtering method, or the like. An alloy material containing aluminum as its main component corresponds to a material which contains aluminum as its main component and which also contains nickel, or an alloy material which contains aluminum as its main component and which also contains nickel and one or both carbon and silicon, for example. The conductive film 1313 preferably employs, for example, a stacked-layer structure including a barrier film, an aluminum-silicon (Al—Si) film, and a barrier film, or a stacked-layer structure including a barrier film, an aluminum-silicon (Al—Si) film, a titanium nitride film, and a barrier film. Note that the barrier film corresponds to a thin film formed of titanium, nitride of titanium, molybdenum, or nitride of molybdenum. Aluminum and aluminum silicon have low resistance and are inexpensive; therefore, they are optimal materials for forming the conductive film 1313. In addition, generation of a hillock of aluminum or aluminum silicon can be prevented when upper and lower barrier layers are formed. Furthermore, in the case where the barrier film is formed by using titanium, which is an element with a high reducing property, even when a thin natural oxide film is formed on a crystalline semiconductor film, the natural oxide film is reduced; so that preferable contact with the crystalline semiconductor film can be obtained.

Next, an insulating film 1314 is formed so as to cover the conductive film 1313. And then, conductive films 1315a and 1315b to be electrically connected to the conductive films 1313 which form the source electrodes or drain electrodes of the thin film transistors 1300a and 1300f are formed over the insulating film 1314. A conductive film 1316 to be electrically connected to the conductive film 1313 which forms the source electrode or drain electrode of the thin film transistor 1300b is formed. Note that the conductive films 1315a and 1315b and the conductive film 1316 may be formed of the same material at the same time. The conductive films 1315a and 1315b and the conductive film 1316 can be formed of any of the materials which are aforementioned for the conductive film 1313.

Next, a conductive film 1317 which serves as an antenna is formed so as to be electrically connected to the conductive film 1316 (see FIG. 10B).

The insulating film 1314 can be formed of a single-layer structure or a stacked-layer structure of an insulating film containing oxygen or nitrogen such as silicon oxide ($SiO_x$), silicon nitride ($SiN_x$), silicon oxynitride ($SiO_xN_y$) (x>y>0), or silicon nitride oxide ($SiN_xO_y$) (x>y>0), a film containing carbon such as DLC (Diamond-Like Carbon), a film of an organic material such as epoxy, polyimide, polyamide, polyvinyl phenol, benzocyclobutene, or acrylic, or a film of a siloxane material such as a siloxane resin, by a CVD method, a sputtering method, or the like. Note that a siloxane material corresponds to a material including a Si—O—Si bond. Siloxane has a skeleton structure containing a bond of silicon (Si) and oxygen (O). As a substituent, an organic group containing at least hydrogen (such as an alkyl group or aromatic hydrocarbon) is used. Alternatively, a fluoro group can be used as the substituent. Further alternatively, an organic group containing at least hydrogen and a fluoro group may be used as the substituent.

The conductive film 1317 is formed of a conductive material by using a CVD method, a sputtering method, a printing method such as a screen printing method or a gravure printing method, a droplet discharging method, a dispensing method, a plating method, or the like. The conductive material is an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing any of the foregoing elements as its main component. The conductive film is formed to have a single-layer structure or a stacked-layer structure.

For example, in the case of forming the conductive film 1317 which serves as the antenna by using a screen printing method, the conductive film 1317 can be provided by selectively printing a conductive paste in which conductive particles having a grain size of several nanometers to several tens of micrometers are dissolved or dispersed in an organic resin. As the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersing nanoparticles can be used. In addition, as the organic resin included in the conductive paste, one or more of organic resins selected from organic resins which serve as a binder, a solvent, a dispersing agent, and a coating member for the metal particles can be used. Typically, an organic resin such as an epoxy resin or a silicone resin can be used. Further, in the formation of the conductive film, baking is preferably performed after the conductive paste is applied. For example, in the case of using fine particles (with the grain size of, for example, grater or equal to 1 nm and less than or equal to 100 nm) containing silver as its main component as a material for the conductive paste, the conductive film can be obtained by hardening the conductive paste by baking it at a temperature of 150 to 300° C. Alternatively, fine particles containing solder or lead-free solder as its main component may be used; in that case, fine particles having a grain size of less than or equal to 20 μm are preferably used. Solder or lead-free solder has advantages such as low cost.

In addition, the conductive films 1315a and 1315b can serve as wirings which are electrically connected to a battery included in a semiconductor device of the present invention in later steps. Alternatively, in the formation of the conductive film 1317, which serves as the antenna, a conductive film may be additionally formed so as to be electrically connected to the conductive films 1315a and 1315b, and the conductive film may be used as the wiring to be connected to the battery.

Next, after an insulating film 1318 is formed so as to cover the conductive film 1317, a layer (hereinafter, referred to as an element formation layer 1319) including the thin film transistors 1300a to 1300f, the conductive film 1317, and the like is peeled off from the substrate 1301. Here, openings are formed by laser light (such as UV light) irradiation in regions where the thin film transistors 1300a to 1300f are not formed (see FIG. 10C), and then, the element formation layer 1319 can be peeled off from the substrate 1301 by physical force. Alternatively, an etchant may be introduced into the formed openings so as to selectively remove the separation layer 1303 before the element formation layer 1319 is peeled off from the substrate 1301. As the etchant, gas or liquid containing halogen fluoride or an interhalogen compound is used. For example, chlorine trifluoride ($ClF_3$) is used as a gas containing halogen fluoride. Thus, the element formation layer 1319 is peeled off from the substrate 1301. Note that the separation layer 1303 may be partially left instead of being removed completely. By leaving the separation layer 1303 partially, consumption of the etchant can be reduced and the time for removing the release layer can be shortened. In addition, the element formation layer 1319 can be held over the substrate 1301 even after the separation layer 1303 is removed. Further, the substrate 1301 is reused after the element formation layer 1319 is peeled off; whereby cost can be reduced.

The insulating film 1318 can be formed of a single-layer structure or a stacked-layer structure of an insulating film containing oxygen or nitrogen such as silicon oxide ($SiO_x$), silicon nitride ($SiN_x$), silicon oxynitride ($SiO_xN_y$) (x>y>0), or silicon nitride oxide ($SiN_xO_y$) (x>y>0), a film containing carbon such as DLC (Diamond-Like Carbon), a film of an organic material such as epoxy, polyimide, polyamide, polyvinyl phenol, benzocyclobutene, or acrylic, or a film of a siloxane material such as a siloxane resin by a CVD method, a sputtering method, or the like.

In this embodiment mode, after the openings are formed in the element formation layer 1319 by laser light irradiation, a first sheet material 1320 is attached to one surface of the element formation layer 1319 (a surface where the insulating film 1318 is exposed), and then, the element formation layer 1319 is peeled off from the substrate 1301 (see FIG. 11A).

Next, a second sheet material 1321 is provided on the other surface (a surface exposed by peeling) of the element formation layer 1319, then, the second sheet material 1321 is attached to the surface one or both a heat treatment and a pressure treatment (see FIG. 11B). As the first sheet material 1320 and the second sheet material 1321, a hot-melt film or the like can be used.

As the first sheet material 1320 and the second sheet material 1321, a film on which an antistatic treatment for preventing static electricity or the like is performed (hereinafter referred to as an antistatic film) can be used. As the antistatic film, a film in which an antistatic material is dispersed in a resin, a film provided with an antistatic material attached thereon, or the like can be given. The film provided with an antistatic material may be a film provided with an antistatic material on one of its surfaces, or a film provided with an antistatic material on its opposing surfaces. As for the film provided with an antistatic material on one of its surfaces, the film may be attached to the layer so that the antistatic material is placed on the inner side of the film or the outer side of the film. Note that the antistatic material may be provided on the entire surface of the film, or on a part thereof. As the antistatic material here, a metal, indium tin oxide (ITO), a surfactant such as an amphoteric surfactant, a cationic surfactant, or a nonionic surfactant can be used. Further, as the antistatic material, a resin material containing cross-linked copolymer having a carboxyl group and a quaternary ammonium base on its side chain, or the like can be used. By attaching, mixing, or applying such a material to a film, an antistatic film can be formed. In the case where the sealing is performed using the antistatic film, adverse effects on a semiconductor element due to external static electricity can be reduced when the semiconductor element is handled as a commercial product.

Note that this embodiment mode can be carried out in combination with a technical element in another embodiment mode in this specification. In other words, in addition to an advantage described in this embodiment mode, such that a transistor is formed with a thin film transistor and a flexible semiconductor device is obtained; even when different clocks are used between a transmitting circuit and a receiving circuit, and a clock of the transmitting circuit which outputs data to be inputted to the receiving circuit and that of the receiving circuit which receives the data are different in transmission and reception of signals between the transmitting circuit and the receiving circuit, the duty ratio of the clock does not change greatly; accordingly, a circuit which allows sufficient set-up time and hold time of a signal can be designed.

Embodiment Mode 4

This embodiment mode describes a manufacturing method of a semiconductor device which is different from the foregoing embodiment mode. A transistor in the present invention can be formed of a MOS transistor using a single crystalline substrate, instead of the thin film transistor over the insulating substrate which is described in the foregoing embodiment modes.

In this embodiment mode, as a circuit for forming a semiconductor device, a p-channel TFT (also referred to as a pch-TFT) and an n-channel TFT (also referred to as an nch-TFT) for forming an inverter or the like are shown as typical examples. Hereinafter, a manufacturing method of a semiconductor device is described with reference to cross-sectional views in FIGS. 12A to 14.

Figure 12A:
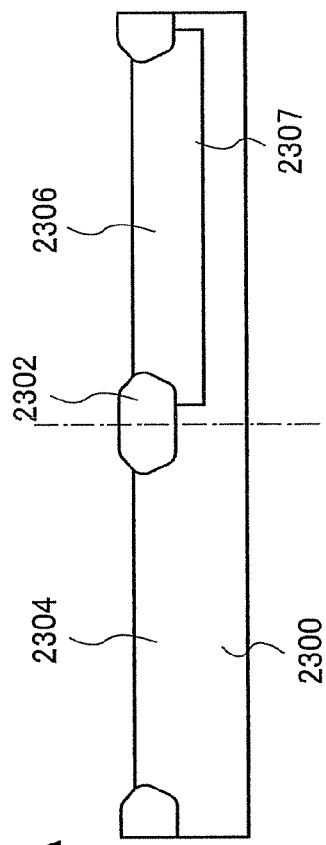
FIGS. 12A to 12C show an example of a manufacturing process of a semiconductor device of the present invention.

First, separated element regions 2304 and 2306 (hereinafter also referred to as the regions 2304 and 2306) are formed in a semiconductor substrate 2300 (see FIG. 12A). The regions 2304 and 2306 provided in the semiconductor substrate 2300 are separated from each other by an insulating film 2302 (also referred to as a field oxide film). In the example described here, a single crystalline Si substrate having n-type conductivity is used as the semiconductor substrate 2300, and a p-well 2307 is provided in the region 2306 in the semiconductor substrate 2300.

The substrate 2300 is not specifically limited and any semiconductor substrate can be used. For example, a single crystalline Si substrate having n-type or p-type conductivity, a compound semiconductor substrate (such as a GaAs substrate, an InP substrate, a GaN substrate, a SiC substrate, a sapphire substrate, or a ZnSe substrate), an SOI (Silicon On Insulator) substrate formed by a bonding method or a SIMOX (Separation by Implanted Oxygen) method, or the like can be used.

The separated element regions 2304 and 2306 can be formed by using a local oxidation of silicon method (a LOCOS method), a trench isolation method, or the like as appropriate.

Furthermore, the p-well in the region 2306 in the semiconductor substrate 2300 can be formed by selectively introducing an impurity element having p-type conductivity into the semiconductor substrate 2300. As the p-type impurity element, boron (B), aluminum (Al), gallium (Ga), or the like can be used.

Note that, although an impurity element is not introduced into the region 2304 since the semiconductor substrate having n-type conductivity is used as the semiconductor substrate 2300 in this embodiment mode, an n-well may be formed in the region 2304 by introducing an n-type impurity element thereinto. As the n-type impurity element, phosphorus (P), arsenic (As), or the like can be used. In the case where a semiconductor substrate having p-type conductivity is used, a structure in which an n-well is formed by introducing an n-type impurity element into the region 2304 and no impurity element is introduced into the region 2306 may be employed.

Figure 12B:
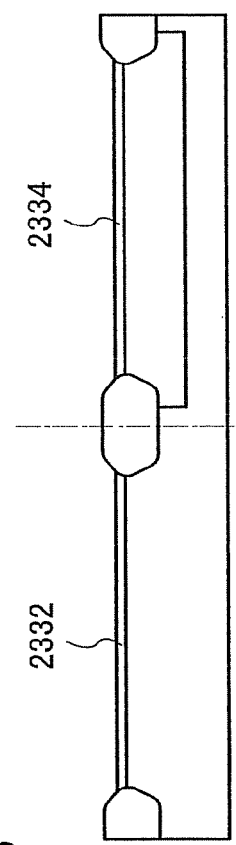

Next, insulating films 2332 and 2334 are formed so as to cover the regions 2304 and 2306, respectively (see FIG. 12B).

The insulating films 2332 and 2334 can be formed of, for example, silicon oxide films by oxidizing surfaces of the regions 2304 and 2306 in the semiconductor substrate 2300 with a heat treatment. Alternatively, the insulating films 2332 and 2334 may be formed of a stacked-layer structure including a silicon oxide film and a film containing oxygen and nitrogen (silicon oxynitride film) by forming the silicon oxide film with a thermal oxidation method, and then nitriding the surface of the silicon oxide film with nitridation treatment.

Further alternatively, the insulating films 2332 and 2334 may be formed using a plasma treatment as described above. For example, by performing an oxidation treatment or a nitridation treatment with a high-density plasma treatment on the surfaces of the regions 2304 and 2306 in the semiconductor substrate 2300, silicon oxide ($SiO_x$) films or silicon nitride ($SiN_x$) films can be formed as the insulating films 2332 and 2334. Further, after an oxidation treatment on the surfaces of the regions 2304 and 2306 by a high-density plasma treatment, a nitridation treatment may be performed by performing high-density plasma treatment again. In this case, silicon oxide films are formed on the surfaces of the regions 2304 and 2306, and silicon oxynitride films are formed on the silicon oxide films, so that each of the insulating films 2332 and 2334 includes the silicon oxide film and the silicon oxynitride film which are stacked. Further alternatively, after silicon oxide films are formed on the surfaces of the regions 2304 and 2306 by a thermal oxidation method, an oxidation treatment or a nitridation treatment may be performed by a high-density plasma treatment.

Each of the insulating films 2332 and 2334 formed in the regions 2304 and 2306 in the semiconductor substrate 2300 serve as a gate insulating film in a transistor completed later.

Figure 12C:
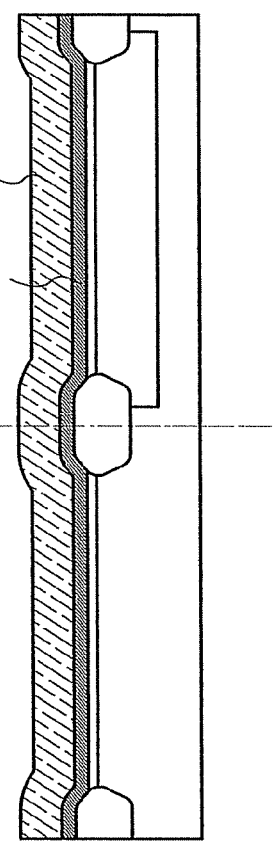

Next, a conductive film is faulted so as to cover the insulating films 2332 and 2334 formed over the regions 2304 and 2306 (see FIG. 12C). In an example shown here, the conductive film is formed by sequentially stacking a conductive film 2336 and a conductive film 2338. Needless to say, the conductive film may be formed to have a single layer or a stacked-layer structure including three or more layers.

The conductive films 2336 and 2338 can be formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the foregoing elements as its main component. Alternatively, a metal nitride film obtained by nitriding any of the foregoing elements can be used. Further alternatively, a semiconductor material typified by polycrystalline silicon doped with an impurity element such as phosphorus can be used.

Here, a stacked-layer structure is provided such that the conductive film 2336 is formed using tantalum nitride and the conductive film 2338 is formed thereon using tungsten. Alternatively, the conductive film 2336 can be formed of a single-layer or stacked-layer film using tungsten nitride, molybdenum nitride, or titanium nitride, and the conductive film 2338 can be formed of a single-layer or stacked-layer film using tantalum, molybdenum, or titanium.

Next, the conductive films 2336 and 2338 which are stacked are selectively etched to be removed so that the conductive films 2336 and 2338 are partially left over the regions 2304 and 2306. Thus, gate electrodes 2340 and 2342 are formed (see FIG. 13A).

Next, a resist mask 2348 is selectively formed so as to cover the region 2304. Then, the region 2306 is doped with an impurity element using the resist mask 2348 and the gate electrode 2342 as masks, thereby forming an impurity region (see FIG. 13B). As the impurity element, an impurity element imparting n-type conductivity or an impurity element imparting p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element.

Figure 13A:
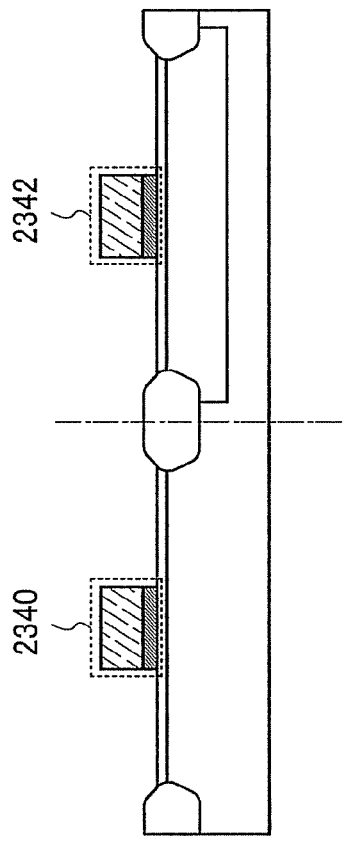
FIGS. 13A to 13C show an example of a manufacturing process of a semiconductor device of the present invention.
Figure 13B:
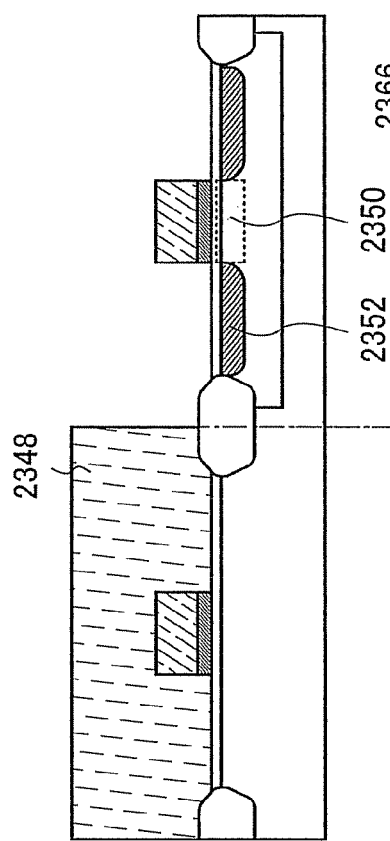
Figure 13C:
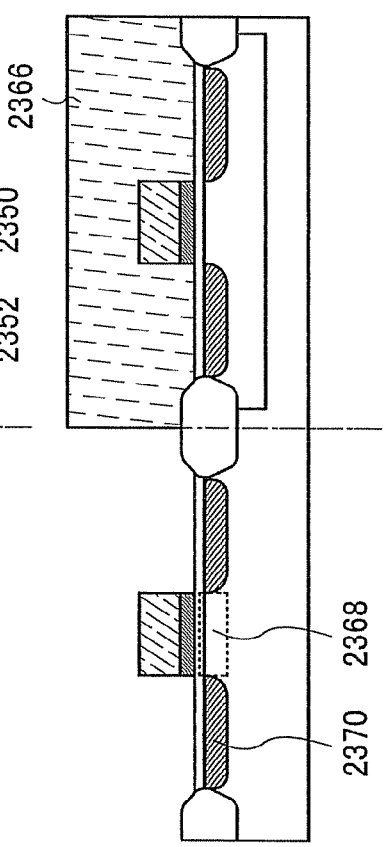
Figure 14:
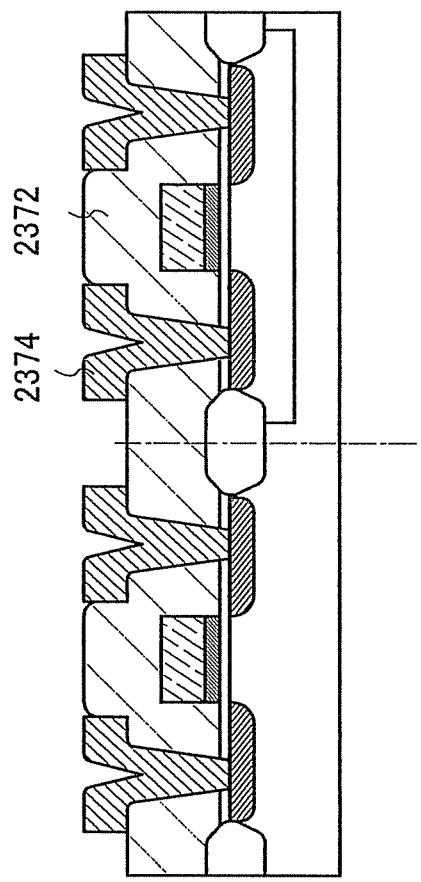
FIG. 14 shows an example of a manufacturing process of a semiconductor device of the present invention.

In FIG. 13B, an impurity region 2352 which fauns a source or drain region and a channel formation region 2350 are formed in the region 2306 by introducing the impurity element.

Next, a resist mask 2366 is selectively formed so as to cover the region 2306. Then, the region 2304 is doped with an impurity element using the resist mask 2366 and the gate electrode 2340 as masks, thereby forming an impurity region (see FIG. 13C). As the impurity element, an impurity element imparting n-type conductivity or an impurity element imparting p-type conductivity is used. As the n-type impurity element, phosphorus (P), arsenic (As), or the like can be used. As the p-type impurity element, boron (B), aluminum (Al), gallium (Ga), or the like can be used. Here, an impurity element which has different conductivity from the impurity element introduced into the region 2306 in FIG. 13B (such as boron (B)) is introduced. As a result, impurity region 2370 which forms a source or drain region and a channel formation region 2368 are formed in the region 2304.

Next, a second insulating film 2372 is formed so as to cover the insulating films 2332 and 2334, and the gate electrodes 2340 and 2342. Wirings 2374 which are electrically connected to the impurity regions 2370 and 2352 formed in the regions 2304 and 2306, respectively, are formed over the second insulating film 2372 (see FIG. 14).

The second insulating film 2372 can be formed of a single-layer structure or a stacked-layer structure of an insulating film containing oxygen or nitrogen such as silicon oxide ($SiO_x$), silicon nitride ($SiN_x$), silicon oxynitride ($SiO_xN_y$) (x>y>0), or silicon nitride oxide ($SiN_xO_y$) (x>y>0), a film containing carbon such as DLC (Diamond-Like Carbon), a film of an organic material such as epoxy, polyimide, polyamide, polyvinyl phenol, benzocyclobutene, or acrylic, or a film of a siloxane material such as a siloxane resin, by a CVD method, a sputtering method, or the like. Note that a siloxane material corresponds to a material including a Si—O—Si bond. Siloxane has a skeleton structure containing a bond of silicon (Si) and oxygen (O). As a substituent, an organic group containing at least hydrogen (such as an alkyl group or aromatic hydrocarbon) is used. Alternatively, a fluoro group can be used as the substituent. Further alternatively, an organic group containing at least hydrogen and a fluoro group may be used as the substituent.

The wiring 2374 is formed of a single layer or a stacked layer of an element selected from, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the foregoing elements as its main component by a CVD method, a sputtering method, or the like. An alloy material containing aluminum as its main component corresponds to a material which contains aluminum as its main component and which also contains nickel, or an alloy material which contains aluminum as its main component and which also contains nickel and one or both carbon and silicon, for example. The wiring 2374 preferably employs, for example, a stacked-layer structure including a barrier film, an aluminum-silicon (Al—Si) film, and a barrier film, or a stacked-layer structure including a barrier film, an aluminum-silicon (Al—Si) film, a titanium nitride film, and a barrier film. Note that the barrier film corresponds to a thin film formed of titanium, nitride of titanium, molybdenum, or nitride of molybdenum. Aluminum and aluminum silicon have low resistance and are inexpensive; therefore, they are optimal materials for forming the wiring 2374. In addition, generation of a hillock of aluminum or aluminum silicon can be prevented when upper and lower barrier layers are formed. Furthermore, when the barrier film is formed by using titanium, which is an element with a high reducing property, even when a thin natural oxide film is formed on a crystalline semiconductor film, the natural oxide film is reduced, so that preferable contact with the crystalline semiconductor film can be obtained.

Note that a transistor forming a semiconductor device of the present invention is not limited to the illustrated structures. For example, a structure of a transistor such as an inverted staggered structure and a fin FET structure can be used. By using a fin FET structure, a short-channel effect due to miniaturization in transistor size can be suppressed, which is preferable.

Note that this embodiment mode can be carried out in combination with a technical element in another embodiment mode in this specification. In other words, in addition to an advantage described in this embodiment mode, such that transistors are formed using a single crystalline substrate and a semiconductor device formed using transistors with less characteristic variation is obtained; even when different clocks are used between a transmitting circuit and a receiving circuit, and a clock of the transmitting circuit which outputs data to be inputted to the receiving circuit and that of the receiving circuit which receives the data are different in transmission and reception of signals between the transmitting circuit and the receiving circuit, the duty ratio of the clock does not change greatly; accordingly, a circuit which allows sufficient set-up time and hold time of a signal can be designed.

Embodiment Mode 5

This embodiment mode describes a manufacturing method of a semiconductor device which is different from the foregoing embodiment mode. A transistor in the present invention can be formed of a MOS transistor using a single crystalline substrate formed by a manufacturing method which is different from that of the MOS transistor using a single crystalline substrate described in the foregoing embodiment modes.

In this embodiment mode, as a circuit for forming a part of a semiconductor device, a p-channel TFT (also referred to as a pch-TFT) and an n-channel TFT (also referred to as an nch-TFT) for forming an inverter or the like are shown as typical examples. Hereinafter, a manufacturing method of a semiconductor device is described with reference to cross-sectional views shown in FIGS. 15A to 18B.

First, an insulating film is formed over a substrate 2600. Here, single crystalline Si having n-type conductivity is used for the substrate 2600, and an insulating film 2602 and an insulating film 2604 are formed over the substrate 2600 (see FIG. 15A). For example, a silicon oxide ($SiO_x$) film is formed as the insulating film 2602 with a heat treatment on the substrate 2600, and a silicon nitride ($SiN_x$) film is formed over the insulating film 2602 by using a CVD method.

The substrate 2600 is not specifically limited and any semiconductor substrate can be used. For example, a single crystalline Si substrate having n-type or p-type conductivity, a compound semiconductor substrate (such as a GaAs substrate, an InP substrate, a GaN substrate, a SiC substrate, a sapphire substrate, or a ZnSe substrate), an SOI (Silicon On Insulator) substrate formed by a bonding method or a SIMOX (Separation by Implanted Oxygen) method, or the like can be used.

The insulating film 2604 may be provided by nitriding the insulating film 2602 by a high-density plasma treatment after the insulating film 2602 is formed. Note that the insulating film provided over the substrate 2600 may be formed of a single layer or a stacked-layer structure including three or more layers.

Next, a pattern of a resist mask 2606 is formed selectively over the insulating film 2604, and etching is selectively performed using the resist mask 2606 as a mask; thereby forming depressions 2608 selectively in the substrate 2600 (see FIG. 15B). The etching of the substrate 2600 and the insulating films 2602 and 2604 can be performed by dry etching utilizing plasma.

Next, after the pattern of the resist mask 2606 is removed, an insulating film 2610 is formed so as to fill the depressions 2608 formed in the substrate 2600 (see FIG. 15C).

The insulating film 2610 is formed using an insulating material such as silicon oxide, silicon nitride, silicon oxynitride ($SiO_xN_y$) (x>y>0), or silicon nitride oxide ($SiN_xO_y$) (x>y>0) by a CVD method, a sputtering method, or the like. Here, a silicon oxide film is formed as the insulating film 2610 by using a TEOS (tetraethylortho silicate) gas and by an atmospheric-pressure CVD method or a low-pressure CVD method.

Next, a surface of the substrate 2600 is exposed by performing a grinding treatment, a polishing treatment, or a CMP (Chemical Mechanical Polishing) treatment. Here, when the surface of the substrate 2600 is exposed, regions 2612 and 2613 are provided between insulating films 2611 formed in the depressions 2608 in the substrate 2600. Note that the insulating films 2611 are obtained by removing a part of the insulating film 2610 which is formed over the surface of the substrate 2600, by the grinding treatment, the polishing treatment, or the CMP treatment. Then, an impurity element having p-type conductivity is selectively introduced, thereby forming a p-well 2615 in the region 2613 in the substrate 2600 (see FIG. 16A).

As the p-type impurity element, boron (B), aluminum (Al), gallium (Ga), or the like can be used. Here, boron (B) is introduced as the impurity element into the region 2613.

Note that, although an impurity element is not introduced into the region 2612 since the semiconductor substrate having n-type conductivity is used as the substrate 2600 in this embodiment mode, an n-well may be formed in the region 2612 by introducing an n-type impurity element thereinto. As the n-type impurity element, phosphorus (P), arsenic (As), or the like can be used.

In the case where a semiconductor substrate having p-type conductivity is used, a structure in which an n-well is formed by introducing an n-type impurity element into the region 2612 and no impurity element is introduced into the region 2613 may be employed.

Figure 16A:
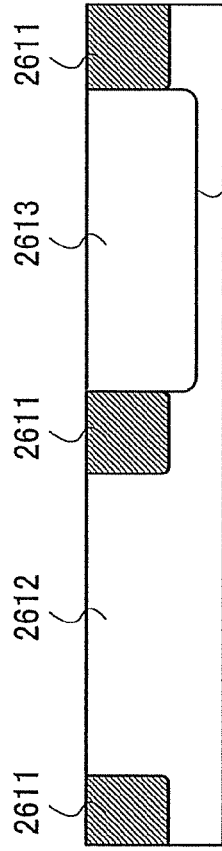
FIGS. 16A to 16C show an example of a manufacturing process of a semiconductor device of the present invention.
Figure 16B:
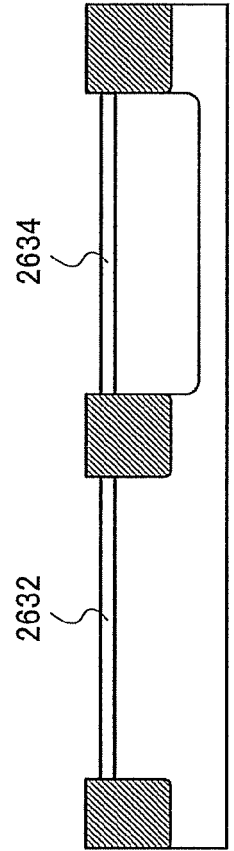

Next, insulating films 2632 and 2634 are formed so as to cover the regions 2612 and 2613, respectively (see FIG. 16B).

The insulating films 2632 and 2634 can be formed of, for example, silicon oxide films by oxidizing surfaces of the regions 2612 and 2613 in the substrate 2600 with a heat treatment. Alternatively, the insulating films 2632 and 2634 may be formed of a stacked-layer structure including a silicon oxide film and a film containing oxygen and nitrogen (silicon oxynitride film) by forming the silicon oxide film with a thermal oxidation method, and then nitriding the surface of the silicon oxide film with nitridation treatment.

Further alternatively, the insulating films 2632 and 2634 may be formed using a plasma treatment as described above. For example, by performing an oxidation treatment or a nitridation treatment with a high-density plasma treatment on the surfaces of the regions 2612 and 2613 in the substrate 2600, silicon oxide ($SiO_x$) films or silicon nitride ($SiN_x$) films can be formed as the insulating films 2632 and 2634. Further, after an oxidation treatment on the surfaces of the regions 2612 and 2613 by a high-density plasma treatment, a nitridation treatment may be performed by performing high-density plasma treatment again. In this case, silicon oxide films are formed on the surfaces of the regions 2612 and 2613, and silicon oxynitride films are formed on the silicon oxide films, so that each of the insulating films 2632 and 2634 includes the silicon oxide film and the silicon oxynitride film which are stacked. Further alternatively, after silicon oxide films are formed on the surfaces of the regions 2612 and 2613 by a thermal oxidation method, an oxidation treatment or a nitridation treatment may be performed by a high-density plasma treatment.

Each of the insulating films 2632 and 2634 formed in the regions 2612 and 2613 in the substrate 2600 serve as a gate insulating film in a transistor completed later.

Figure 16C:
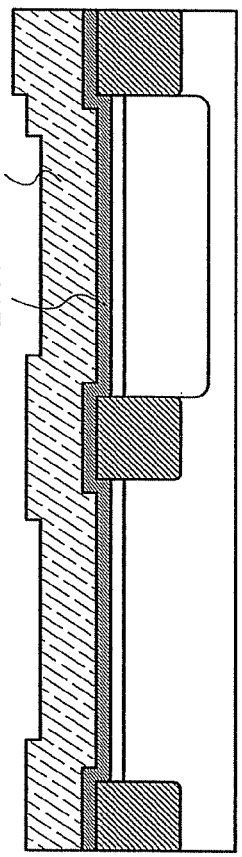

Next, a conductive film is formed so as to cover the insulating films 2632 and 2634 formed over the regions 2612 and 2613 provided in the substrate 2600 (see FIG. 16C). In an example shown here, the conductive film is formed by sequentially stacking a conductive film 2636 and a conductive film 2638. Needless to say, the conductive film may be formed to have a single layer or a stacked-layer structure including three or more layers.

The conductive films 2336 and 2338 can be formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the foregoing elements as its main component. Alternatively, a metal nitride film obtained by nitriding any of the foregoing elements can be used. Further alternatively, a semiconductor material typified by polycrystalline silicon doped with an impurity element such as phosphorus can be used.

Here, a stacked-layer structure is provided such that the conductive film 2636 is formed using tantalum nitride and the conductive film 2638 is formed thereon using tungsten. Alternatively, the conductive film 2636 can be formed of a single-layer or stacked-layer film using tungsten nitride, molybdenum nitride, or titanium nitride, and the conductive film 2638 can be formed of a single-layer or stacked-layer film using tungsten, tantalum, molybdenum, or titanium.

Next, the conductive films 2636 and 2638 which are stacked are selectively etched to be removed so that the conductive films 2636 and 2638 are partially left over the regions 2612 and 2613. Thus, conductive films 2640 and 2642 serving as gate electrodes are formed (see FIG. 17A). In addition, in the substrate 2600 here, parts of the surfaces of the regions 2612 and 2613 which are not overlapped with the conductive films 2640 and 2642 are exposed.

Specifically, in the region 2612 in the substrate 2600, a part of the insulating film 2632 formed under the conductive film 2640, which is not overlapped with the conductive film 2640 is selectively removed so that ends of the conductive film 2640 and the insulating film 2632 are roughly aligned. In the region 2613 in the substrate 2600, a part of the insulating film 2634 formed under the conductive film 2642, which is not overlapped with the conductive film 2642 is selectively removed so that ends of the conductive film 2642 and the insulating film 2634 are roughly aligned.

In this case, parts of the insulating film and the like which are not overlapped with the conductive films 2640 and 2642 may be removed at the same time as the formation of the conductive films 2640 and 2642, or may be removed after the formation of the conductive films 2640 and 2642 by using the resist mask which is left or the conductive films 2640 and 2642 as masks.

Next, an impurity element is selectively introduced into the regions 2612 and 2613 in the substrate 2600 (see FIG. 17B) to form impurity regions 2648 and 2650. Here, an impurity element imparting n-type conductivity is selectively introduced at a low concentration into the region 2613 by using the conductive film 2642 as a mask, and an impurity element imparting p-type conductivity is selectively introduced at a low concentration into the region 2612 by using the conductive film 2640 as a mask. As the impurity element imparting n-type conductivity, phosphorus (P), arsenic (As), or the like can be used. As the impurity element imparting p-type conductivity, boron (B), aluminum (Al), gallium (Ga), or the like can be used.

Next, sidewalls 2654 are formed in contact with side surfaces of the conductive films 2640 and 2642. Specifically, a single layer or a stacked layer of a film containing an inorganic material such as silicon, oxide of silicon, or nitride of silicon, or a film containing an organic material such as an organic resin is formed by a plasma CVD method, a sputtering method, or the like. Then, the insulating film is selectively etched by anisotropic etching which etches mainly in a vertical direction, so that the insulating film can be formed in contact with the side surfaces of the conductive films 2640 and 2642. Note that the sidewalls 2654 are used as masks in doping for forming LDD (Lightly Doped Drain) regions. Further, here, the sidewalls 2654 are formed in contact with side surfaces of the insulating films formed under the conductive films 2640 and 2642 as well.

Figure 17A:
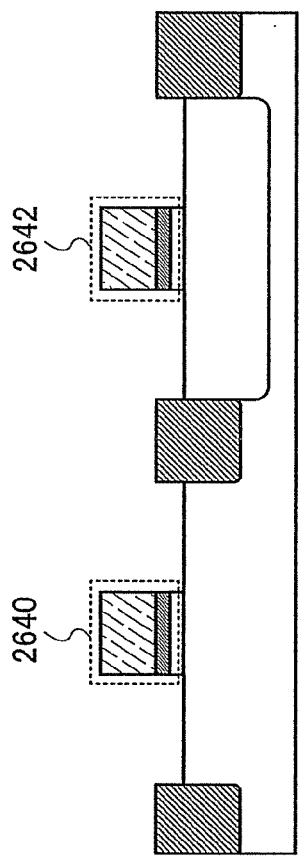
FIGS. 17A to 17C show an example of a manufacturing process of a semiconductor device of the present invention.
Figure 17B:
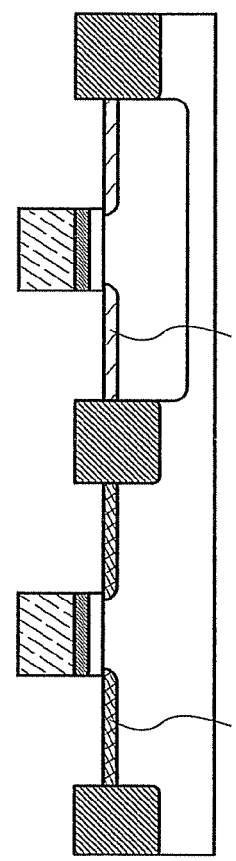
Figure 17C:
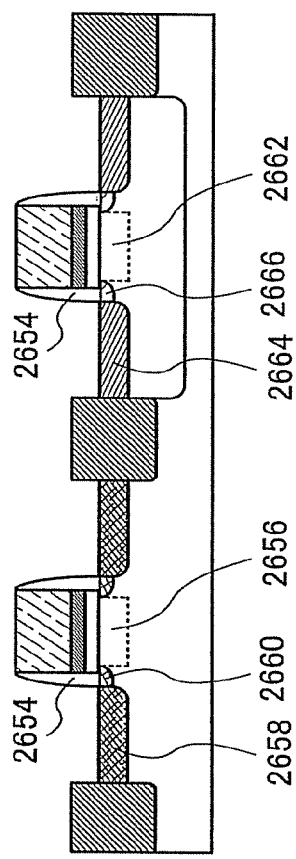

Next, an impurity element is introduced into the regions 2612 and 2613 in the substrate 2600 by using the sidewalls 2654 and the conductive films 2640 and 2642 as masks; thereby forming impurity regions serving as source and drain regions (see FIG. 17C). Here, an impurity element imparting n-type conductivity is introduced at a high concentration into the region 2613 in the substrate 2600 by using the sidewalls 2654 and the conductive film 2642 as masks, and an impurity element imparting p-type conductivity is introduced at a high concentration into the region 2612 by using the sidewalls 2654 and the conductive film 2640 as masks.

As a result, in the region 2612 in the substrate 2600, an impurity region 2658 forming a source or drain region, a low-concentration impurity region 2660 forming an LDD region, and a channel formation region 2656 are formed. In the region 2613 in the substrate 2600, an impurity region 2664 forming a source or drain region, a low-concentration impurity region 2666 forming an LDD region, and a channel formation region 2662 are formed.

Note that in this embodiment mode, the impurity element is introduced under a condition in which the parts of the regions 2612 and 2613 in the substrate 2600 which are not overlapped with the conductive films 2640 and 2642 are exposed. Therefore, the channel formation regions 2656 and 2662 formed in the regions 2612 and 2613 in the substrate 2600 can be formed in a self-aligned manner with respect to the conductive films 2640 and 2642, respectively.

Figure 18A:
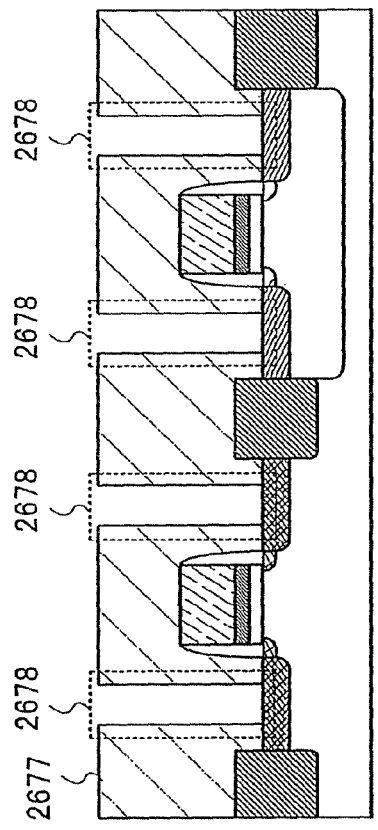
FIGS. 18A and 18B show an example of a manufacturing process of a semiconductor device of the present invention.

Next, a second insulating film 2677 is formed so as to cover the insulating films, the conductive films, and the like provided over the regions 2612 and 2613 in the substrate 2600, and then, openings 2678 are formed in the second insulating film 2677 (see FIG. 18A).

The second insulating film 2677 can be formed of a single-layer structure or a stacked-layer structure of an insulating film containing oxygen or nitrogen such as silicon oxide ($SiO_x$), silicon nitride ($SiN_x$), silicon oxynitride ($SiO_xN_y$) (x>y>0), or silicon nitride oxide ($SiN_xO_y$) (x>y>0), a film containing carbon such as DLC (Diamond-Like Carbon), a film of an organic material such as epoxy, polyimide, polyamide, polyvinyl phenol, benzocyclobutene, or acrylic, or a film of a siloxane material such as a siloxane resin, by a CVD method, a sputtering method, or the like. Note that a siloxane material corresponds to a material including a Si—O—Si bond. Siloxane has a skeleton structure containing a bond of silicon (Si) and oxygen (O). As a substituent, an organic group containing at least hydrogen (such as an alkyl group or aromatic hydrocarbon) is used. Alternatively, a fluoro group can be used as the substituent. Further alternatively, an organic group containing at least hydrogen and a fluoro group may be used as the substituent.

Figure 18B:
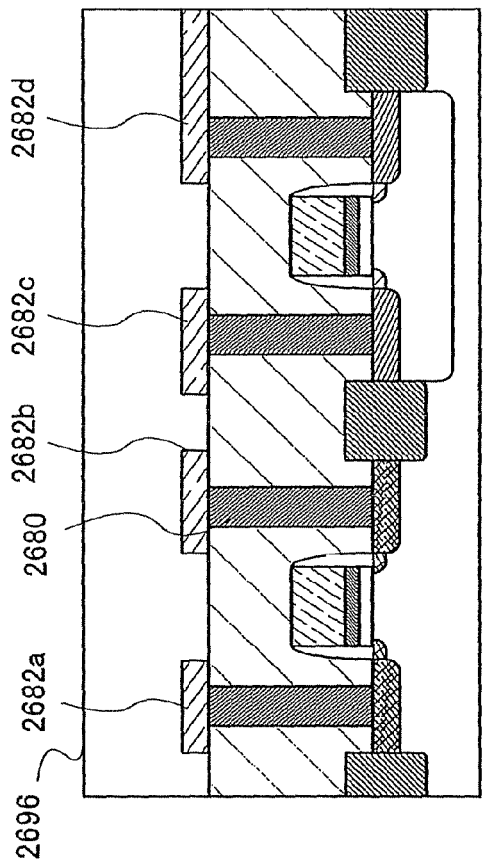

Next, conductive films 2680 are formed in the openings 2678 by using a CVD method, and conductive films 2682a to 2682d are selectively formed over the second insulating film 2677 so as to be electrically connected to the conductive films 2680 (see FIG. 18B).

The conductive films 2680 and 2682a to 2682d are formed of a single layer or a stacked layer of an element selected from, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the foregoing elements as its main component by a CVD method, a sputtering method, or the like. An alloy material containing aluminum as its main component corresponds to a material which contains aluminum as its main component and which also contains nickel, or an alloy material which contains aluminum as its main component and which also contains nickel and one or both carbon and silicon, for example. The conductive films 2680 and 2682a to 2682d preferably employ, for example, a stacked-layer structure including a barrier film, an aluminum-silicon (Al—Si) film, and a barrier film, or a stacked-layer structure including a barrier film, an aluminum-silicon (Al—Si) film, a titanium nitride film, and a barrier film. Note that the barrier film corresponds to a thin film formed of titanium, nitride of titanium, molybdenum, or nitride of molybdenum. Aluminum and aluminum silicon have low resistance and are inexpensive; therefore, they are optimal materials for forming the conductive films 2680 and 2682a to 2682d. In addition, generation of a hillock of aluminum or aluminum silicon can be prevented when upper and lower barrier layers are formed. Furthermore, when the barrier film is formed by using titanium, which is an element with a high reducing property, even when a thin natural oxide film is formed on a crystalline semiconductor film, the natural oxide film is reduced, so that preferable contact with the crystalline semiconductor film can be obtained. Here, the conductive films 2680 and 2682a to 2682d can be formed by selective growth of tungsten (W) by a CVD method.

Through the foregoing steps, a semiconductor device provided with a p-channel transistor formed using the region 2612 and an n-channel transistor formed using the region 2613 in the substrate 2600 can be obtained.

Note that a transistor forming a semiconductor device of the present invention is not limited to the illustrated structures. For example, a structure of a transistor such as an inverted staggered structure and a fin PET structure can be used. By using a fin PET structure, a short-channel effect due to miniaturization in transistor size can be suppressed, which is preferable.

Note that this embodiment mode can be carried out in combination with another embodiment mode in this specification. In other words, in addition to an advantage described in this embodiment mode, such that transistors are formed using a single crystalline substrate and a semiconductor device formed using transistors with less characteristic variation is obtained; even when different clocks are used between a transmitting circuit and a receiving circuit, and a clock of the transmitting circuit which outputs data to be inputted to the receiving circuit and that of the receiving circuit which receives the data are different in transmission and reception of signals between the transmitting circuit and the receiving circuit, the duty ratio of the clock does not change greatly; accordingly, a circuit which allows sufficient set-up time and hold time of a signal can be designed.

Embodiment Mode 6

A method of using a semiconductor device 3000 serving as an RFID tag which is described in the foregoing embodiment mode is described with reference to FIGS. 6A to 6F.

A semiconductor device can be applied to a wide range of purposes. For example, the semiconductor device can be attached to bank notes, coins, securities, bearer bonds, certificates (such as a driver's license or a residence card, see FIG. 6A), packaging containers (such as package paper or a bottle, see FIG. 6C), recording media (such as DVD software or a video tape, see FIG. 6B), vehicles (such as a bicycle, see FIG. 6D), personal belongings (such as a bag or glasses), foods, plants, animals, human bodies, clothes, general merchandise, electronic appliances, luggage tags (see FIGS. 6E and 6F), and the like. The electronic appliances include a liquid crystal display device, an EL display device, a television device (also referred to as a TV, a TV receiver, or a television receiver), a mobile phone, and the like.

The semiconductor device 3000 of the present invention has a memory element of the present invention and is fixed to a product by being mounted onto a printed board, attached to a surface of the product, or embedded inside the product. For example, when the product is a book, the device is fixed to the book by embedding the device inside paper, and when the product is a package made of an organic resin, the device is fixed to the package by being embedded inside the organic resin. Since the semiconductor device 3000 of the present invention can be compact, thin, and lightweight, it does not degrade the quality of design after the semiconductor device is fixed to a product. Further, when the semiconductor device 3000 of the present invention is provided to bank notes, coins, securities, bearer bonds, certificates, and the like, an authentication function can be provided. With the use of this authentication function, forgery can be prevented. Further, when the semiconductor device of the present invention is attached to packaging containers, recording media, personal belongings, foods, clothes, general merchandise, electronic appliances, and the like, systems such as an inspection system can be made efficient.

Note that this embodiment mode can be carried out in combination with a technical element in another embodiment mode in this specification. In other words, by applying the present invention to a clock generation circuit in the semiconductor device serving as an RFID tag, which is described in this embodiment mode; even when different clocks are used between a transmitting circuit and a receiving circuit, and a clock of the transmitting circuit which outputs data to be inputted to the receiving circuit and that of the receiving circuit which receives the data are different in transmission and reception of signals between the transmitting circuit and the receiving circuit, the duty ratio of the clock does not change greatly; accordingly, a circuit which allows sufficient set-up time and hold time of a signal can be designed.

This application is based on Japanese Patent Application serial no. 2006-236846 filed in Japan Patent Office on August 31, in 2006, the entire contents of which are hereby incorporated by reference.

What is claimed is:

1. A semiconductor device comprising:
a power supply circuit comprising a regulator;
a first circuit configured to receive a first clock signal and a first signal and output a second signal; and
a second circuit configured to receive the second signal and output a second clock signal,
wherein the power supply circuit is configured to supply a power supply voltage regulated by the regulator to the first circuit and the second circuit,
wherein the first circuit is configured to increment a value of the second signal in accordance with the first clock signal,
wherein the first circuit is configured to reset the value of the second signal in accordance with the first signal,
wherein the second circuit is configured to generate the second clock signal,
wherein a cycle of the second clock signal corresponds to a period while the value of the second signal grows by a value, and
wherein a first cycle of the second clock signal in a first period is longer than a second cycle of the second clock signal in a second period.

2. The semiconductor device according to claim 1,
wherein the first circuit is configured to keep the value of the second signal when the first clock signal changes in the first period.

3. The semiconductor device according to claim 1, further comprising a third circuit,
wherein the third circuit is configured to receive a third signal and output the first signal when the third signal changes.

4. The semiconductor device according to claim 1, further comprising a fourth circuit,
wherein the fourth circuit is configured to generate the first clock signal.

5. The semiconductor device according to claim 4,
wherein the fourth circuit comprises a ring oscillator.

6. The semiconductor device according to claim 1, further comprising a third circuit and a fourth circuit,
wherein the first circuit is configured to keep the value of the second signal when the first clock signal changes in the first period,
wherein the third circuit is configured to receive a third signal and output the first signal when the third signal changes, and
wherein the fourth circuit is configured to generate the first clock signal.

7. The semiconductor device according to claim 6,
wherein the fourth circuit comprises a ring oscillator.

8. A semiconductor device comprising:
an antenna configured to receive a wireless signal and generate an electromotive force from the wireless signal;
a power supply circuit configured to generate a power supply voltage by regulating the electromotive force,
a first circuit configured to receive a first clock signal and a first signal and output a second signal; and
a second circuit configured to receive the second signal and output a second clock signal,
wherein the power supply circuit is configured to supply the power supply voltage to the first circuit and the second circuit,
wherein the first circuit is configured to increment a value of the second signal in accordance with the first clock signal,
wherein the first circuit is configured to reset the value of the second signal in accordance with the first signal,
wherein the second circuit is configured to generate the second clock signal,
wherein a cycle of the second clock signal corresponds to a period while the value of the second signal grows by a value, and
wherein a first cycle of the second clock signal in a first period is longer than a second cycle of the second clock signal in a second period.

9. The semiconductor device according to claim 8,
wherein the first circuit is configured to keep the value of the second signal when the first clock signal changes in the first period.

10. The semiconductor device according to claim 8, further comprising a third circuit,
wherein the third circuit is configured to receive a third signal and output the first signal when the third signal changes.

11. The semiconductor device according to claim 8, further comprising a fourth circuit,
wherein the fourth circuit is configured to generate the first clock signal.

12. The semiconductor device according to claim 11,
wherein the fourth circuit comprises a ring oscillator.

13. The semiconductor device according to claim 8, further comprising a third circuit and a fourth circuit,
wherein the first circuit is configured to keep the value of the second signal when the first clock signal changes in the first period,
wherein the third circuit is configured to receive a third signal and output the first signal when the third signal changes, and wherein the fourth circuit is configured to generate the first clock signal.

14. The semiconductor device according to claim 13, wherein the fourth circuit comprises a ring oscillator.

15. A semiconductor device comprising:
an antenna configured to receive a wireless signal and generate an electromotive force from the wireless signal;
a first power supply circuit configured to generate a first power supply voltage by regulating the electromotive force,
a second power supply circuit configured to generate a second power supply voltage from the electromotive force,
a first circuit configured to receive a first clock signal and a first signal and output a second signal;
a second circuit configured to receive the second signal and output a second clock signal; and
a third circuit configured to operate using the second clock signal,
wherein the first power supply circuit is configured to supply the first power supply voltage to the first circuit and the second circuit,
wherein the second power supply circuit is configured to supply the second power supply voltage to the third circuit,
wherein the first circuit is configured to increment a value of the second signal in accordance with the first clock signal,
wherein the first circuit is configured to reset the value of the second signal in accordance with the first signal,
wherein the second circuit is configured to generate the second clock signal,
wherein a cycle of the second clock signal corresponds to a period while the value of the second signal grows by a value, and
wherein a first cycle of the second clock signal in a first period is longer than a second cycle of the second clock signal in a second period.

16. The semiconductor device according to claim 15, wherein the first circuit is configured to keep the value of the second signal when the first clock signal changes in the first period.

17. The semiconductor device according to claim 15, further comprising a fourth circuit,
wherein the fourth circuit is configured to receive a third signal and output the first signal when the third signal changes.

18. The semiconductor device according to claim 15, further comprising a fifth circuit,
wherein the fifth circuit is configured to generate the first clock signal.

19. The semiconductor device according to claim 18, wherein the fifth circuit comprises a ring oscillator.

20. The semiconductor device according to claim 15, further comprising a fourth circuit and a fifth circuit,
wherein the first circuit is configured to keep the value of the second signal when the first clock signal changes in the first period,
wherein the fourth circuit is configured to receive a third signal and output the first signal when the third signal changes, and
wherein the fifth circuit is configured to generate the first clock signal.

21. The semiconductor device according to claim 20, wherein the fifth circuit comprises a ring oscillator.

* * * * *